United States Patent
Kang et al.

(10) Patent No.: US 7,663,910 B2
(45) Date of Patent: Feb. 16, 2010

(54) PHASE CHANGE MEMORY DEVICE

(75) Inventors: Hee Bok Kang, Chungcheongbuk-do (KR); Jin Hong An, Gyeonggi-do (KR); Suk Kyoung Hong, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 10 days.

(21) Appl. No.: 12/135,241

(22) Filed: Jun. 9, 2008

(65) Prior Publication Data
US 2009/0027953 A1    Jan. 29, 2009

(30) Foreign Application Priority Data
Jul. 24, 2007  (KR) ...................... 10-2007-0073852

(51) Int. Cl.
*G11C 11/00* (2006.01)
(52) U.S. Cl. ....................................... 365/163; 365/148
(58) Field of Classification Search ................. 365/163, 365/148, 100
See application file for complete search history.

(56) References Cited

U.S. PATENT DOCUMENTS

| | | | | |
|---|---|---|---|---|
| 6,982,913 B2 * | 1/2006 | Oh et al. | ..................... | 365/203 |
| 7,433,253 B2 * | 10/2008 | Gogl et al. | ................... | 365/209 |
| 7,539,068 B2 * | 5/2009 | Wang et al. | ............. | 365/189.06 |
| 2006/0209585 A1 | 9/2006 | Tanizaki et al. | | |
| 2006/0221678 A1 * | 10/2006 | Bedeschi et al. | ............ | 365/163 |
| 2007/0103972 A1 | 5/2007 | Ro et al. | | |

* cited by examiner

*Primary Examiner*—Anh Phung
(74) *Attorney, Agent, or Firm*—Ladas & Parry LLP

(57) ABSTRACT

A phase change memory device includes a plurality of word lines arranged in a row direction and a plurality of bit lines arranged in a column direction. A plurality of reference bit line and a plurality of clamp bit lines are arranged in the column direction. A cell array block including a phase change resistance cell is arranged where a word line and a bit line intersect. A reference cell array block is formed where a word line and the reference bit line intersect. The reference cell array block is configured to output a reference current. A clamp cell array block is formed where a word line and a clamp bit line intersect. The clamp cell array block is configured to output a clamp current. A sense amplifier is connected to each of the bit lines and is configured to receive a clamp voltage and a reference voltage.

17 Claims, 18 Drawing Sheets

PHASE CHANGE MEMORY DEVICE

CROSS REFERENCE TO RELATED APPLICATIONS

The present application claims priority to Korean Patent Application No. 10-2007-73852 filed on Jul. 24, 2007 which is incorporated herein by reference in its entirety.

BACKGROUND OF THE INVENTION

The present invention relates generally to a phase change memory device, and more particularly, to a phase change memory device with improved stability of reference and clamp voltages resulting in an improved offset characteristic in a sense amplifier.

Unlike volatile RAM, nonvolatile memory devices are capable of conserving data even when the power of the device is turned off. Examples of nonvolatile memory include a magnetic memory and a phase change memory (PCM). These nonvolatile memory devices have a data processing speed similar to that of a volatile Random Access Memory (RAM), and can conserve data even after the power is turned off.

FIGS. 1a and 1b are diagrams illustrating a conventional phase change resistor (PCR) 4.

The PCR 4 comprises a phase change material (PCM) 2 interposed between a top electrode 1 and a bottom electrode 3. When a voltage is applied and a current is transmitted through the device, a high temperature is generated in the PCM 2 so that an electric conductive state is changed depending on a change in resistance occurring due to the applied high temperature. The PCM includes AgLnSbTe. Typically, the PCM 2 includes chalcogenide having chalcogen elements (S, Se, Te) as a main ingredient, and more specifically a germanium antimonic tellurium consisting of Ge—Sb—Te.

FIGS. 2a and 2b are diagrams illustrating the operating principle of the conventional PCR 4.

As shown in FIG. 2a, the PCM 2 can be crystallized when a low current, i.e., a current less than a threshold value, flows through the PCR R4. The crystallized PCM 2 has a low resistance.

As shown in FIG. 2b, the PCM 2 becomes amorphous when a high current, i.e., a current more than a threshold value, flows through the PCR 4, since at this time, the temperature resulting from the high current in the PCM 2 is greater than the melting point. The amorphous PCM 2 has a high resistance.

Using this phenomenon, the PCR 4 can be configured to store nonvolatile data corresponding to the two different resistance states. For example, data logic value "1" corresponds to the crystallized PCR 4 (low resistance state), and data logic value "0" corresponds to the amorphous PCR 4 (high resistance state), and accordingly the logic states of the data can be stored using the PCR 4.

FIG. 3 is a diagram illustrating a write operation of a conventional phase change resistant cell.

Heat is generated when current flows between the top electrode 1 and the bottom electrode 3 of the PCR 4 for a given amount of time. As a result, the state of the PCM 2 changes to a crystalline or an amorphous state depending on the temperature resulting from the current flowing between the top electrode 1 and the bottom electrode 3.

For example, when a low current flows for a given time, the PCM 2 becomes crystalline due to a low temperature heating state, and thus the PCR 4 is at a low resistance state (set state). Conversely, when a high current flows for a given time, the PCM 2 becomes amorphous due to a high temperature heating state, and thus the PCR 4 is at a high resistance state (reset state). The difference between the two phases is determined based on the value of the electric resistance present in the PCM 2.

In the PCR 4, the low voltage required for changing the phase change material to a crystalline state must be applied to the PCR 4 for a long period of time in order to write the set state in a write mode. Conversely, the high voltage required for changing the PC 2 to an amorphous state need only be applied to the PCR 4 for a short time in order to write the reset state in the write mode.

However, phase change memory devices are not without problems. When the reference voltage of a phase change memory device having phase change resistors is not effectively controlled, the sensing efficiency of a sense amplifier is degraded. As such, the reference current is unstable, and the accuracy and the offset characteristic of the sense amplifier are degraded causing deterioration in the data sensing margin and yield of a chip.

SUMMARY

The present invention includes a phase change memory device solving the above mention problems.

Embodiments of the present invention include a phase change memory device having phase change resistors that provides improved stability and accuracy of reference currents using a reference cell array that is under the same conditions as a cell array.

Additionally, embodiments of the present invention include a phase change memory device having phase change resistors that provides improved stability and accuracy of clamp voltages using a clamp cell array that is under the same conditions as a cell array.

Additionally, embodiments of the present invention include a phase change memory device having phase change resistors that improves the sensing efficiency of a sense amplifier using a reference cell array having the same timing delay element.

Additionally, embodiments of the present invention include a phase change memory device having phase change resistors that improves the offset characteristic of a sense amplifier.

Additionally, embodiments of the present invention include reference and clamp voltages are generated using an equalizing circuit that is under the same conditions as a main cell array, wherein the equalizing circuit generating reference and clamp voltages that reflect characteristics of a main cell changing in response to process changes within the device.

According to one embodiment of the present invention, a phase change memory device includes: a plurality of word lines arranged in a row direction; a plurality of bit lines arranged in a column direction; a reference bit line arranged in the column direction; a plurality of clamp bit lines arranged in the column direction; a cell array block including a plurality of phase change resistance cells arranged where a word line and a bit line intersect; a reference cell array block formed where a word line and the reference bit line intersect and configured to output a reference current; a clamp cell array block formed where a word line and a clamp bit line intersect and configured to output a clamp current; is and a sense amplifier connected to the bit lines and configured to receive a clamp voltage and a reference voltage.

According to another embodiment, a phase change memory device comprises: a plurality of word lines arranged in a row direction; a plurality of bit lines arranged in a column direction; a reference bit line arranged in the column direction; a cell array block including a phase change resistance cell arranged where a word line and a bit line intersect; a reference cell array block formed where a word line and the reference bit line intersect and configured to output a reference current; a clamp cell array block configured to output a clamp voltage in response to a clamp enable signal; a reference voltage generating unit connected to the reference bit line and configured to generate a reference voltage corresponding to the reference current; and a sense amplifier connected to the bit lines and configured to receive the clamp voltage and the reference voltage.

DESCRIPTION OF SPECIFIC EMBODIMENTS

Figure 1A:
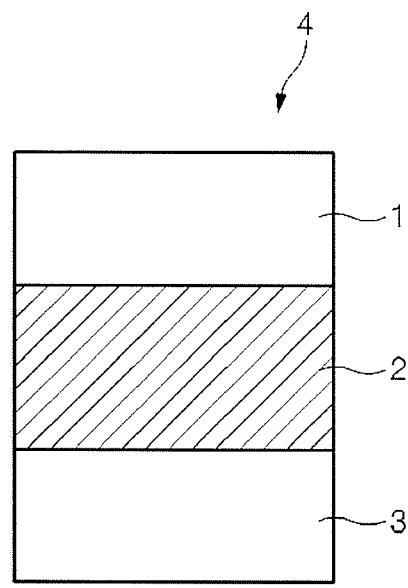
FIGS. 1a and 1b are diagrams illustrating a conventional phase change resistor.
Figure 1B:
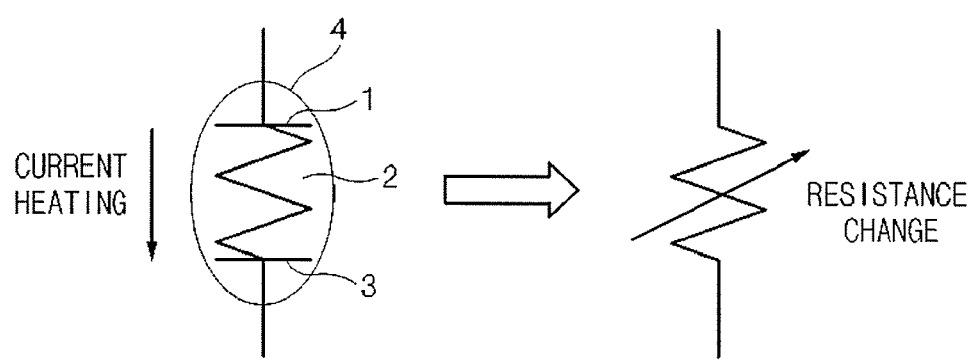
Figure 2A:
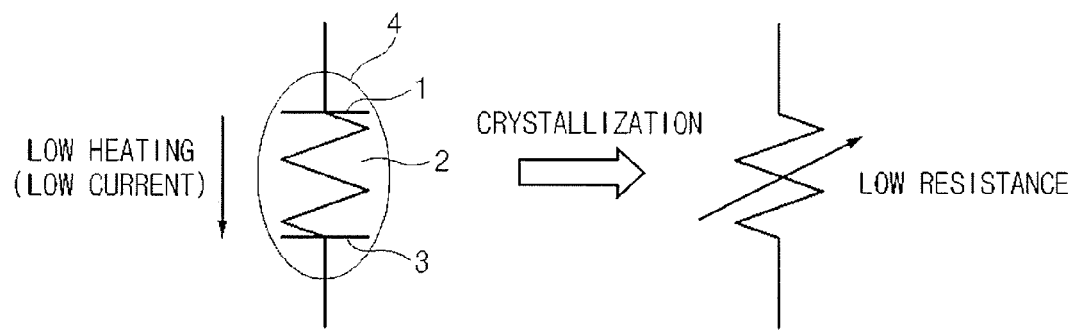
FIGS. 2a and 2b are diagrams illustrating the principle of operation of the conventional phase change resistor.
Figure 2B:
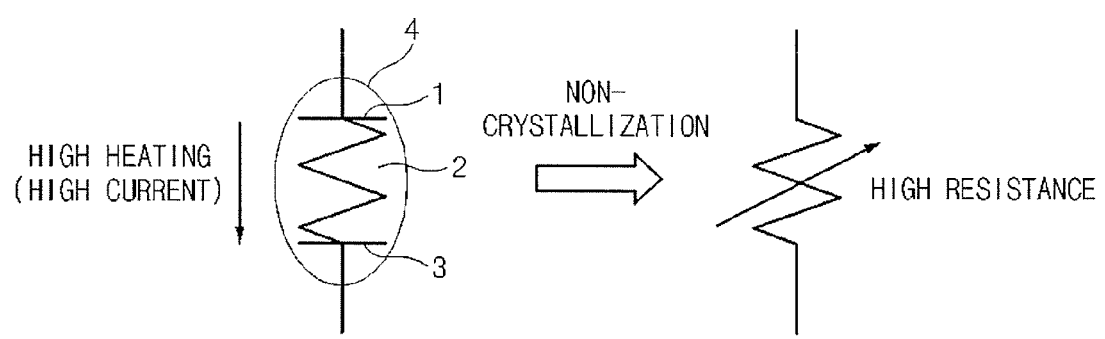
Figure 3:
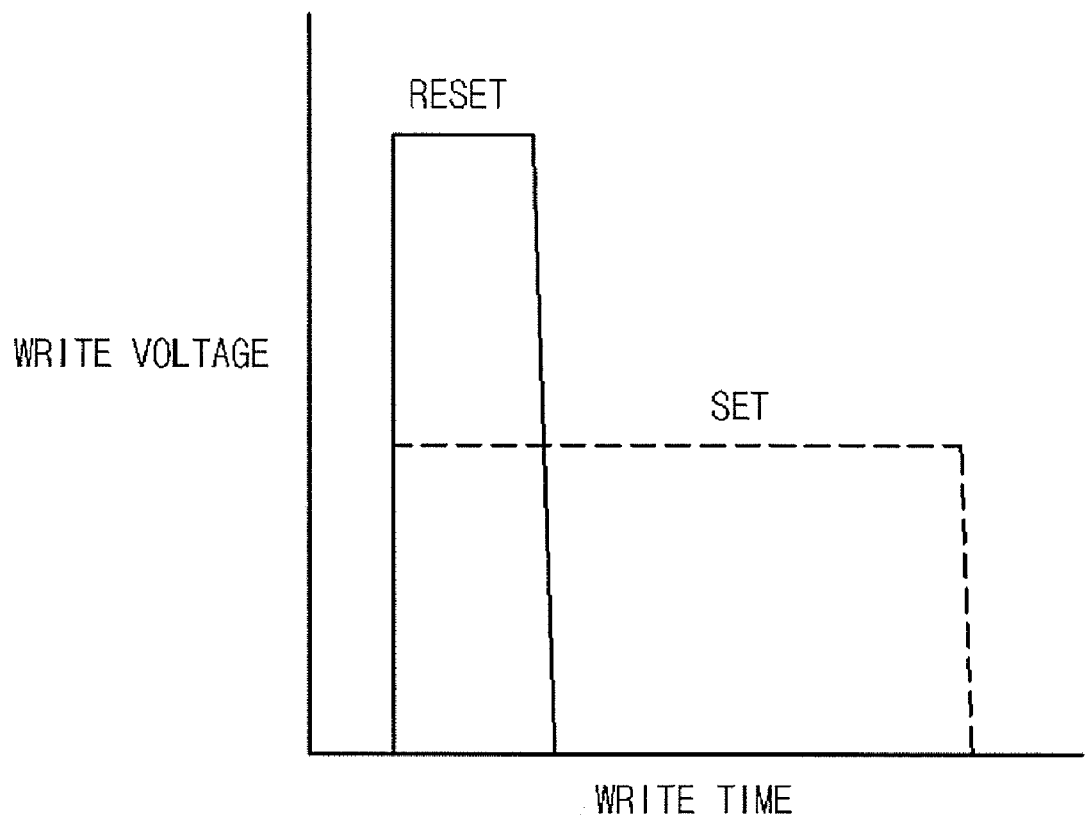
FIG. 3 is a diagram illustrating the write operation of the conventional phase change resistant cell.
Figure 4:
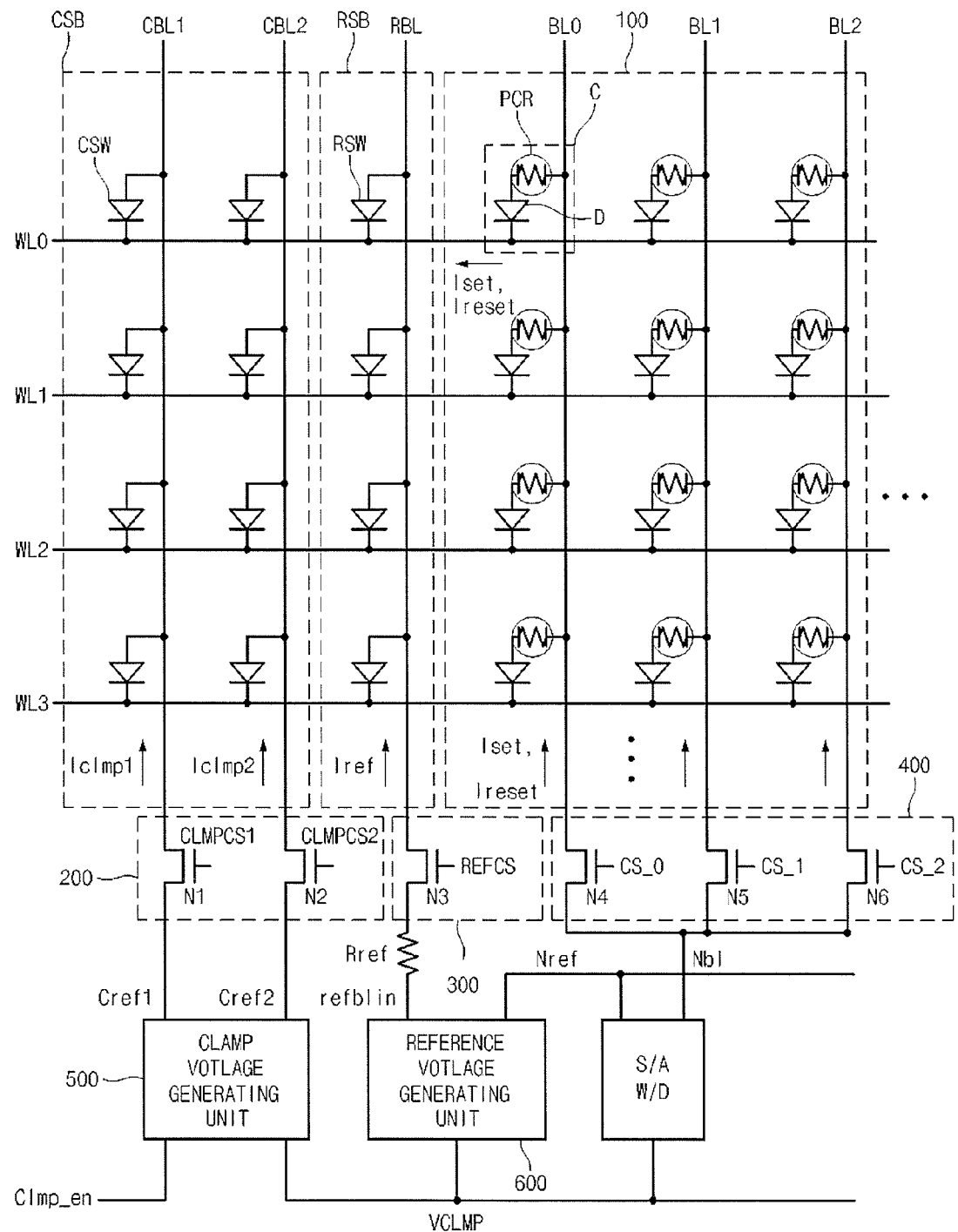
FIG. 4 is a circuit diagram showing a phase change memory device according to an embodiment of the present invention.

FIG. 4 is a circuit diagram showing a phase change memory device according to an embodiment of the present invention.

The phase change memory device shown in FIG. 4 comprises a clamp cell array block CSB, a reference cell array block RSB, a cell array block 100, a clamp column selecting unit 200, a reference column selecting unit 300, a column selecting unit 400, a reference resistor Rref, a clamp voltage generating unit 500, a reference voltage generating unit 600, a sense amplifier S/A, and a write driving unit W/D.

The cell array block 100 includes a plurality of bit lines BL0~BL2 arranged in the column direction and a plurality of word lines WL0~WL3 arranged in the row direction. The cell array block 100 includes a plurality of unit cells C arranged where the bit lines BL0~BL2 and the word lines WL0~WL3 intersect. Each unit cell C includes a phase change resistor PCR and a diode D. The diode D comprises a PN diode element.

One electrode of the phase change resistor PCR is connected to the bit line BL, and the other electrode is connected to the P-type region of the diode D. The N-type region of the diode D is connected to the word line WL. In order to write data, the phase of the phase change resistor PCR is changed in response to one of a set current Iset and a reset current Ireset flowing in the bit line BL.

The clamp cell array block CSB includes a pair of clamp bit lines CBL1, CBL2 arranged in the column direction, and the word lines WL0~WL3 arranged in a row direction intersect the clamp bit lines CBL1, CBL2. The clamp cell array block CSB includes a plurality of clamp switches CSW each of which is arranged where one of the paired clamp bit lines CBL1, CBL2 intersects with one of the word lines WL0~WL3.

The clamp switch CSW, which is a cell selecting switch element, comprises a PN diode element. The paired clamp bit lines CBL1, CBL2 are commonly used for the plurality of bit lines BL0~BL2.

The P-type region of the clamp switch CSW is connected to the clamp bit line CBL, and the N-type region is connected to the word line WL. Clamp currents Iclmp1, Iclmp2 flow through the clamp bit lines CBL1, CBL2.

The clamp column selecting unit 200 includes clamp column switches. A clamp column switch is connected between the clamp voltage generating unit 500 and each of the paired clamp bit lines CBL1, CBL2. The clamp column switch includes NMOS transistors N1, N2, and the gates of the NMOS transistors N1, N2 receive clamp column selecting signals CLMPCS1, CLMPCS2.

The reference cell array block RSB includes a reference bit line RBL arranged in the column direction and intersecting the word lines WL0~WL3 arranged in the row direction. The reference cell array block RSB includes a plurality of reference switches RSW each of which is arranged where one of the reference bit lines RBL intersects one of the word lines WL0~W3.

The reference switch RSW, which is a cell selecting switch element, comprises a PN diode element. A single reference bit line RBL is commonly used for the plurality of bit lines BL0~BL2.

The P-type region of each reference switch RSW is connected to a reference bit line RBL and the N-type region connected to intersecting word line WL. A reference current Iref flows through the reference bit line RBL.

The reference column selecting unit 300 includes a reference column switch connected between the reference bit line RBL of the reference cell array block RSB and the reference resistor Rref. The gate of the reference column switch receives a reference column selecting signal REFCS. The reference column switch comprises an NMOS transistor N3. The reference resistor Rref, which is for flowing of the reference current Iref, is connected between the NMOS transistor N3 and a reference bit line node refblin.

Each bit line BL of the cell array block 100 is connected to the column selecting unit 400. The column selecting unit 400 includes a plurality of column switches, and a column selecting unit 400 is connected between each of the bit lines BL and a common bit line node Nbl. The gate of each of the column switches receives one of a plurality of column selecting signals CS_0~CS_2. Each of the column switches comprises one of the NMOS transistors N4~N6.

The clamp voltage generating unit 500 generates a clamp voltage VCLMP in response to a clamp enable signal Clmp_en and clamp reference signals Cref1, Cref2. The reference voltage generating unit 600 generates a reference voltage and supplies the reference voltage to a reference node Nref in response to the clamp voltage VCLMP and the signal of the reference bit line node refblin.

The sense amplifier S/A distinguishes a data logic value "1" from a date logic value "0" according to cell data transmitted from the cell array block 100 through the node Nbl, the reference voltage lo transmitted through the reference node Nref, and the clamp voltage VCLMP. When data is to be written, the write driving unit W/D supplies a driving voltage corresponding to the data to be written to the node Nbl.

When the device is in read mode, a low voltage level is transmitted to the selected word line WL, and a read voltage Vread is transmitted to the bit line BL. The sense amplifier S/A amplifies data by utilizing the set current Iset (or reset current Ireset) flowing in the word line WL and flowing in the reference cell from the bit line BL, the phase change resistor PCR, and the diode D; the reference current Iref flowing in a reference cell; and clamp currents Iclmp1, Iclmp2 flowing in a clamp cell.

Figure 5:
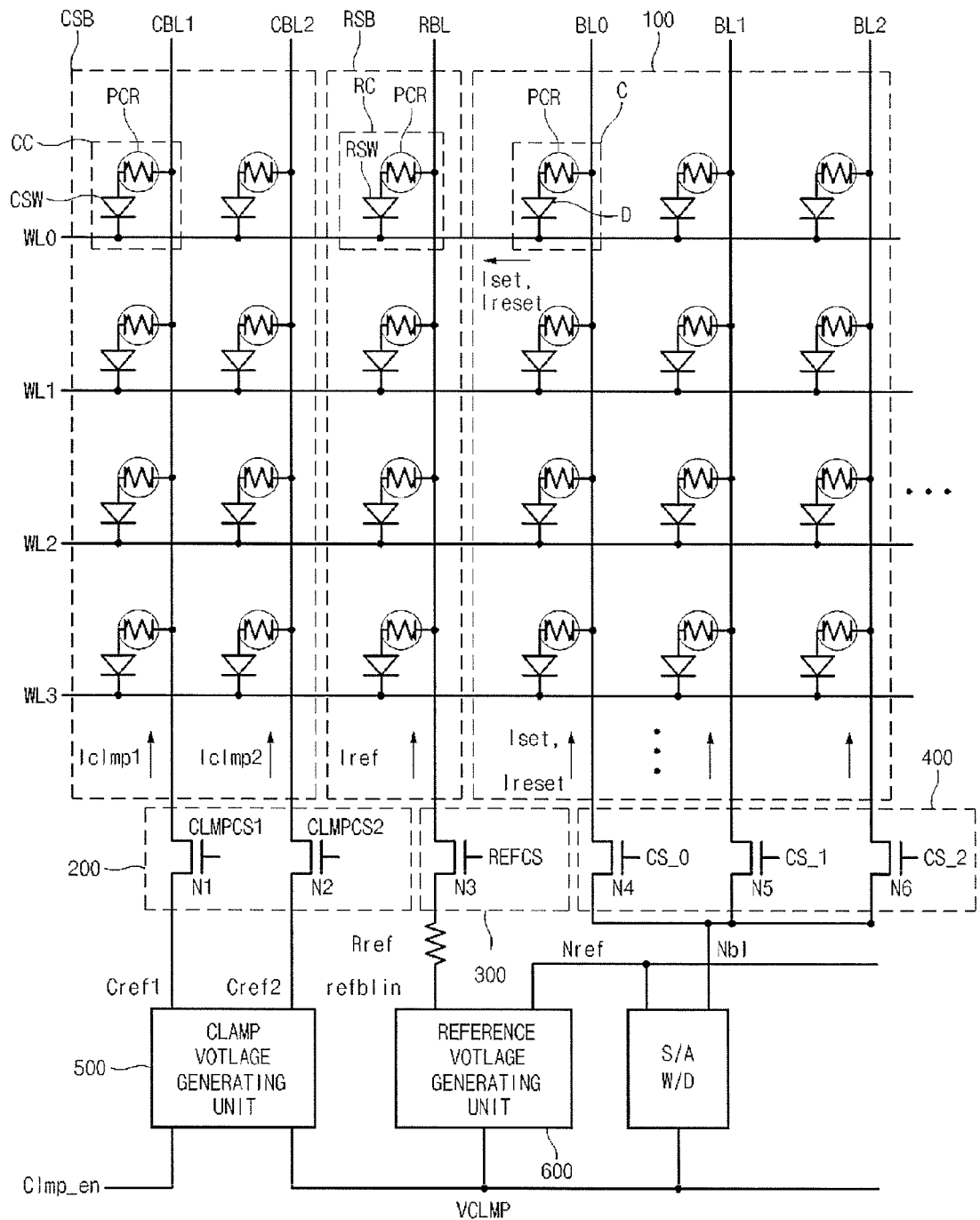
FIG. 5 is a circuit diagram showing a phase change memory device according to an embodiment of the present invention.

FIG. 5 is a circuit diagram showing a phase change memory device according to an embodiment of the present invention.

The phase change memory device comprises a clamp cell array block CSB, a reference cell array block RSB, a cell array block 100, a clamp column selecting unit 200, a reference column selecting unit 300, a column selecting unit 400, a reference resistor Rref, a clamp voltage generating unit 500, a reference voltage generating unit 600, a sense amplifier S/A, and a write driving unit W/D.

The cell array block 100 includes a plurality of bit lines BL0~BL2 arranged in the column direction and a plurality of word lines WL0~WL3 arranged in the row direction. The cell array block 100 includes a plurality of unit cells C arranged where the bit lines BL0~BL2 and the word lines WL0~WL3 intersect. Each unit cell C includes a phase change resistor PCR and a diode D. The diode D comprises a PN diode element.

One electrode of the phase change resistor PCR is connected to the bit line BL, and the other electrode is connected to the P-type region of the diode D. The N-type region of the diode D is connected to the word line WL. In order to write data, the phase of the phase change resistor PCR is changed in response to one of a set current Iset and a reset current Ireset flowing in the bit line BL.

The clamp cell array block CSB includes a pair of clamp bit lines CBL1, CBL2 arranged in the column direction, and the word lines WL0~WL3 arranged in the row direction intersect the clamp bit lines CBL1, CBL2. The clamp cell array block CSB includes a plurality of unit clamp cells CC each of which is arranged where one of the paired clamp bit lines CBL1, CBL2 intersects one of the word lines WL0~WL3. Each unit clamp cell CC includes a phase change resistor PCR and a clamp switch CSW. The clamp switch CSW, which is a cell selecting switch element, includes a PN diode element.

One electrode of the phase change resistor PCR is connected to the clamp bit line CBL, and the other electrode is connected to a P-type region of the clamp switch CSW. The N-type region of the clamp switch CSW is connected to the word line WL. The paired clamp bit lines CBL1, CBL2 are commonly used for the plurality of bit lines BL0~BL2. Clamp currents Iclmp1, Iclmp2 flow through the bit lines CBL1, CBL2.

The clamp column selecting units 200 includes clamp column switches each of which is connected between one of the paired clamp bit lines CBL1, CBL2 and the clamp voltage generating unit 500. The clamp column switch includes NMOS transistors N1, N2, and the gates of the NMOS transistors N1, N2 receive the clamp column selecting signals CLMPCS1, CLMPCS2.

The reference cell array block RSB includes a reference bit line RBL arranged in a column direction and intersecting the word lines WL0~WL3 arranged in the row direction. The reference cell array block RSB includes a plurality of unit reference cells RC each of which is arranged where one of the reference bit lines RBL intersects one of the word lines WL0~WL3. Each unit reference cell RC includes a phase change resistor PCR and a reference switch RSW.

The reference switch RSW, which is a cell selecting switch element, comprises a PN diode element. A single reference bit line RBL is commonly used for the plurality of bit lines BL0~BL2.

One electrode of the phase change resistor PCS is connected to the reference bit line RBL, and the other electrode is connected to the P-type region of the reference switch RSW. The N-type region of the reference switch RSW is connected to the word line WL. A reference current Iref flows through the reference bit line RBL.

The reference column selecting unit 300 includes a reference column switch connected between the reference bit line RBL of the reference cell array block RSB and the reference resistor Rref. The gate of the reference column switch receives a reference column selecting signal REFCS. The reference column switch comprises an NMOS transistor N3. The reference resistor Rref, which is for flowing of the reference current Iref, is connected between the NMOS transistor N3 and a reference bit line node refblin.

Each bit line BL of the cell array block 100 is connected to the column selecting unit 400. The column selecting unit 400 includes a plurality of column switches. Each column switch is connected between one of the bit lines BL and a node Nbl, and the gate of each column switch receives one of a plurality of column selecting signals CS_0~CS_2. Each column switches comprises one of the NMOS transistors N4~N6.

The clamp voltage generating unit 500 generates a clamp voltage VCLMP in response to a clamp enable signal Clmp_en and clamp reference signals Cref1, Cref2. The reference voltage generating unit 600 generates a reference voltage and supplies the reference voltage to a reference node Nref in response to the clamp voltage VCLMP and a signal of the reference bit line node refblin.

The sense amplifier S/A distinguishes a data logic value "1" from a data logic value "0" in response to cell data transmitted from the cell array block 100 through the node Nbl; the reference voltage transmitted through the reference node Nref; and the clamp voltage VCLMP. When data is to be written, the write driving unit W/D supplies a driving voltage corresponding to the data to be written to the node Nbl.

When the device is in read mode, a low voltage level is transmitted to the selected word line WL, and a read voltage Vread is transmitted to the bit line BL. The sense amplifier S/A amplifies data by utilizing the set current Iset (or reset current Ireset) flowing in the word line WL and flowing in the reference cell through the bit line BL, the phase change resistor PCR, and the diode D; the reference current Iref flowing in a reference cell; and clamp currents IcImp1, IcImp2 flowing in a clamp cell.

Figure 6:
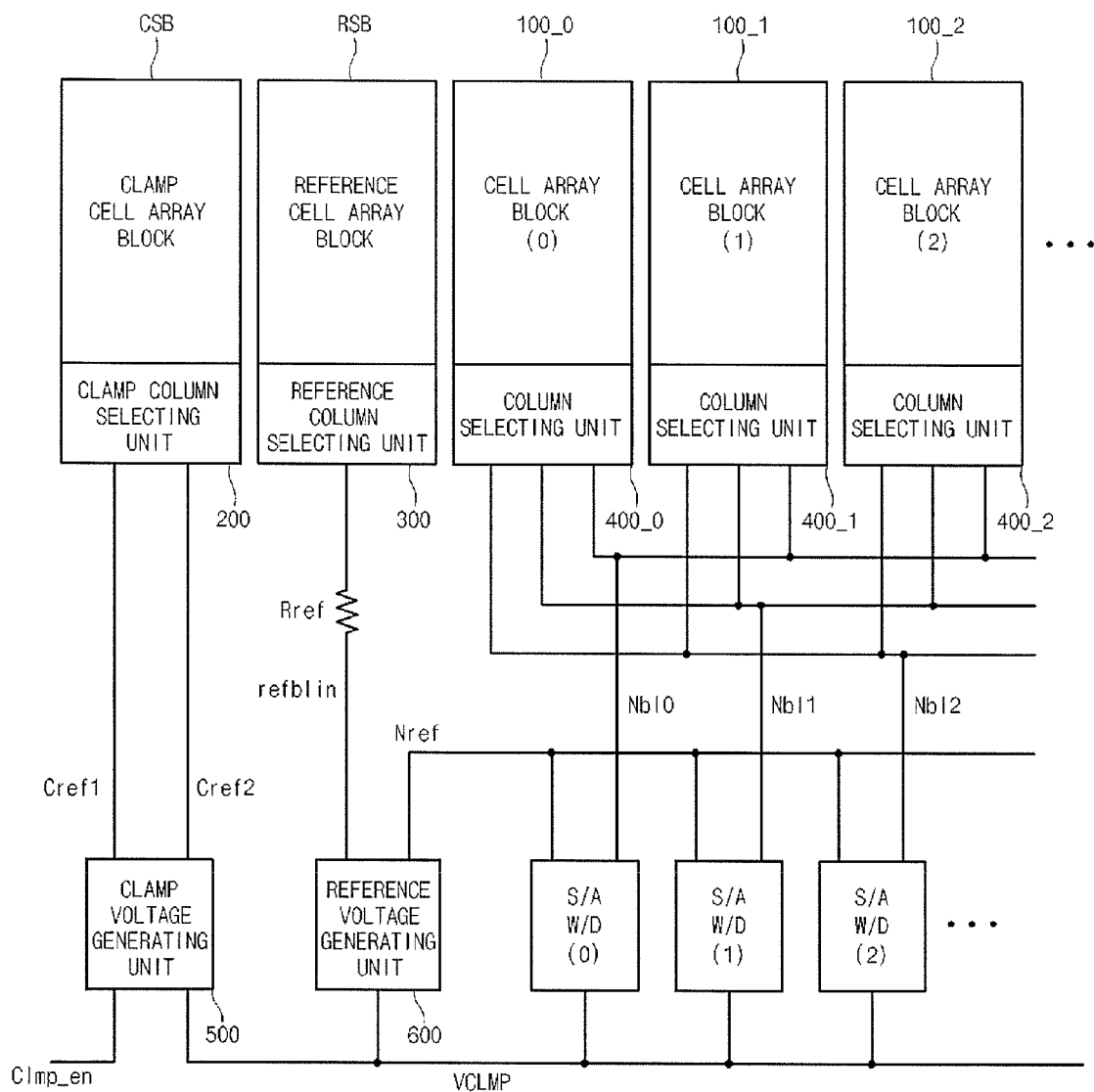
FIG. 6 is a block diagram showing a phase memory device according to an embodiment of the present invention.

FIG. 6 is a block diagram showing a phase memory device according to an embodiment of the present invention.

The phase change memory device comprises a clamp cell array block CSB, a reference cell array block RSB, a plurality of cell array blocks 100_0~100_2, a clamp column selecting unit 200, a reference column selecting unit 300, a plurality of column selecting units 400_0~400_2 a reference resistor Rref, a clamp voltage generating unit 500, a reference voltage generating unit 600, and a one or more sense amplifiers S/A and write driving units W/D.

The clamp column selecting unit 200 is connected to the clamp cell array block CSB and is disposed in a lower region of the clamp cell array block CSB. The clamp column selecting unit 200 outputs clamp reference signals Cre1, Cref2. The clamp voltage generating unit 500 is connected to the clamp column selecting unit 200 and generates a clamp voltage VCLMP in response to the clamp reference signals Cref1, Cref2 and a clamp enable signal Clmp_en.

The reference column selecting unit 300 is connected to the reference cell array block RSB, and is disposed in a lower region of the reference cell array block RSB. The reference column selecting unit 300 is connected to the reference voltage generating unit 600 through the reference resistor Rref. The reference resistor Rref is connected between the reference column selecting unit 300 and a reference bit line node refblin. The reference voltage generating unit 600 outputs a reference voltage to a reference node Nref in response to the clamp voltage VCLMP and a voltage of the reference bit line node refblin.

The column selecting units 400_0~400_2 are connected one by one to the cell array blocks 100_0~100_2 (i.e., each of the column selecting units corresponds and is connected to one of the cell array blocks), and the column selecting units 400_0~400_2 are each disposed in a region under the corresponding one of the cell array blocks 100_0~100_2. The reference node Nref is connected to each of the one or more sense amplifiers S/A and write driving units W/D (FIG. 6 includes a plurality of sense amplifiers S/A and write driving units W/D, and each column selecting unit is connected to one of the sense amplifiers S/A). The column selecting units 400 are connected one by one to nodes Nbl0~Nbl2 each of which is connected to one of the sense amplifiers S/A.

In FIG. 6, the sense amplifier S/A(0) is connected to the node Nbl0 and the reference node Nref. The sense amplifier S/A(1) is connected to the node Nbl1 and the reference node Nref. The sense amplifier S/A(2) is connected to the node Nbl2 and the reference node Nref.

Figure 7:
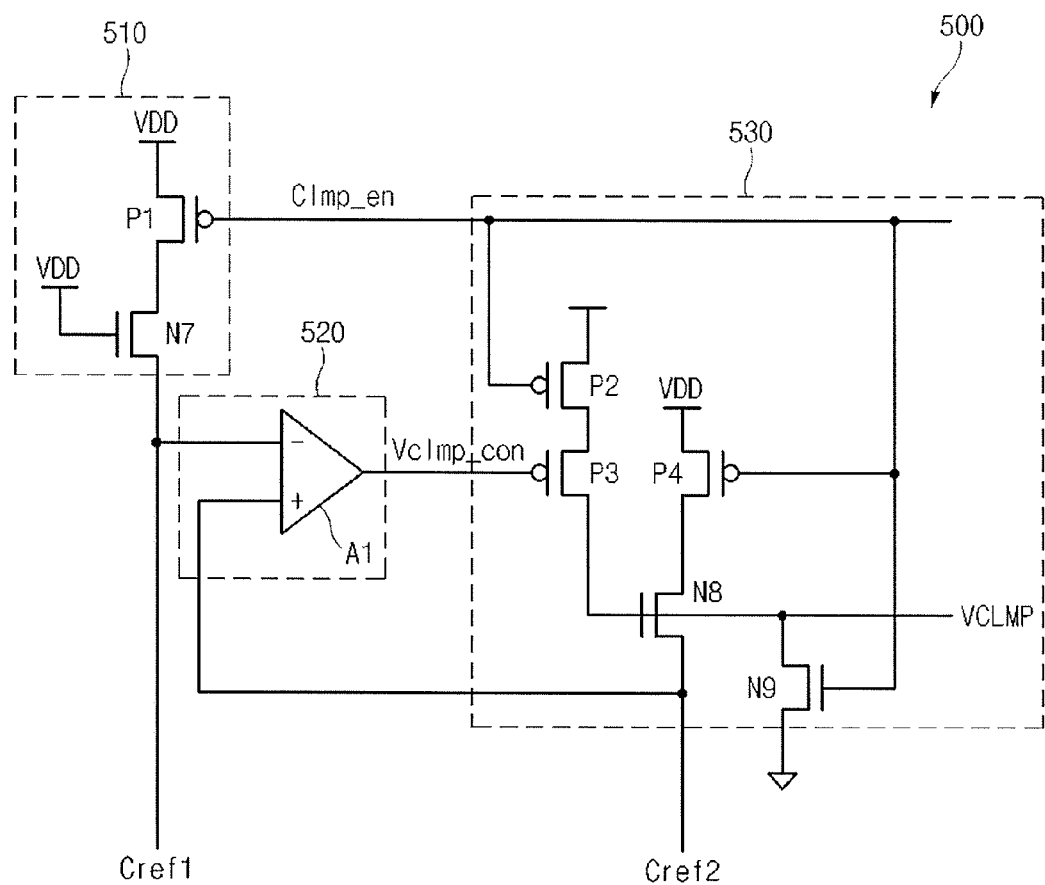
FIG. 7 is a diagram showing the clamp voltage generating unit of FIG. 6.

FIG. 7 is a circuit diagram showing the clamp voltage generating unit 500 of FIG. 6.

The clamp voltage generating unit 500 includes a reference bias unit 510, a clamp voltage adjusting unit 520, and a clamp voltage output unit 530.

The reference bias unit 510 includes a PMOS transistor P1 and an NMOS transistor N7. The PMOS transistor P1 is connected between a power voltage VDD terminal and the NMOS transistor N7, and the gate of the PMOS transistor P1 receives the clamp enable signal Clmp_en. The NMOS transistor N7 is connected between the PMOS transistor P1 and the clamp reference signal Cref1 terminal, and the gate of the NMOS transistor N7 receives the power voltage VDD.

The clamp voltage adjusting unit 520 includes an amplifier A1 that outputs a clamp voltage control signal VCLMP_con. The negative (−) terminal of the amplifier A1 is connected to the clamp bit line CBL1 to receive the clamp reference signal Cref1. The positive terminal of the amplifier A1 is connected to the clamp bit line CBL2 to receive the clamp reference signal Cref2.

The clamp voltage output unit 530 includes PMOS transistors P2~P4 and NMOS transistors N8, N9. The PMOS transistor P2 is connected between a power voltage terminal and the PMOS transistor P3, and the gate of the PMOS transistor P2 receives the clamp enable signal Clmp_en. The PMOS transistor P3 is connected between the PMOS transistor P2 and the gate of the NMOS transistor N8, and the gate of the PMOS transistor P3 receives the clamp voltage control signal VCLMP_con.

The PMOS transistor P4 is connected between the power voltage VDD terminal and the NMOS transistor N8, and the gate of the PMOS transistor P4 receives the clamp enable signal Clmp_en. The NMOS transistor N8 is connected between the PMOS transistor P4 and the clamp reference signal Cref2 terminal, and the gate of the NMOS transistor N3 is connected to the clamp voltage VCLMP terminal. The NMOS transistor N9 is connected between the clamp voltage VCLMP terminal and a ground voltage terminal, and the gate of the NMOS transistor N9 receives the clamp enable signal Clmp_en.

The operation of the clamp voltage generating unit 500 is explained below.

The circuit structure of the reference bias unit 510 is designed to generate a reference voltage for generating the clamp voltage VCLMP. The reference bias unit 510 sets a load value so that the current value of the clamp reference signal Cref1 flowing in the clamp bit line CBL1 is normal.

The reference bias unit 510 is activated in response to the clamp enable signal Clmp_en. A predetermined target current value is determined according to the NMOS transistor N7.

The clamp voltage adjusting unit 520 is an amplifying circuit configured to receive the clamp reference signal Cref1 such that the clamp reference signal Cref2 is determined according to the clamp reference signal Cref1. That is, the amplifier A1 outputs the clamp voltage control signal VCLMP_con in response to the clamp reference signal Cref1 to adjust the clamp reference signal Cref2.

The clamp voltage output unit 530 controls the output of the clamp voltage VCLMP. The clamp voltage output unit 530 is activated in response to the clamp enable signal Clmp_en.

When the clamp enable signal Clmp_en is inactivated (at a high level), the NMOS transistor N9 is turned on and the clamp voltage VCLMP is maintained at a ground voltage level. Conversely, when the clamp enable signal Clmp_en is activated (at a low level), the PMOS transistors P1, P2, P4 are activated.

The PMOS transistor P3 controls the clamp voltage VCLMP in response to the clamp voltage control signal VCLMP_con. The NMOS transistor N8 determines the voltage of the clamp reference signal Cref2 in response to the clamp voltage VCLMP.

A positive (+) terminal of the amplifier A1 receives the clamp reference signal Cref2 to adjust the clamp voltage VCLMP. The clamp reference signals Cref1, Cref2 are set to maintain a predetermined offset voltage.

Figure 8:
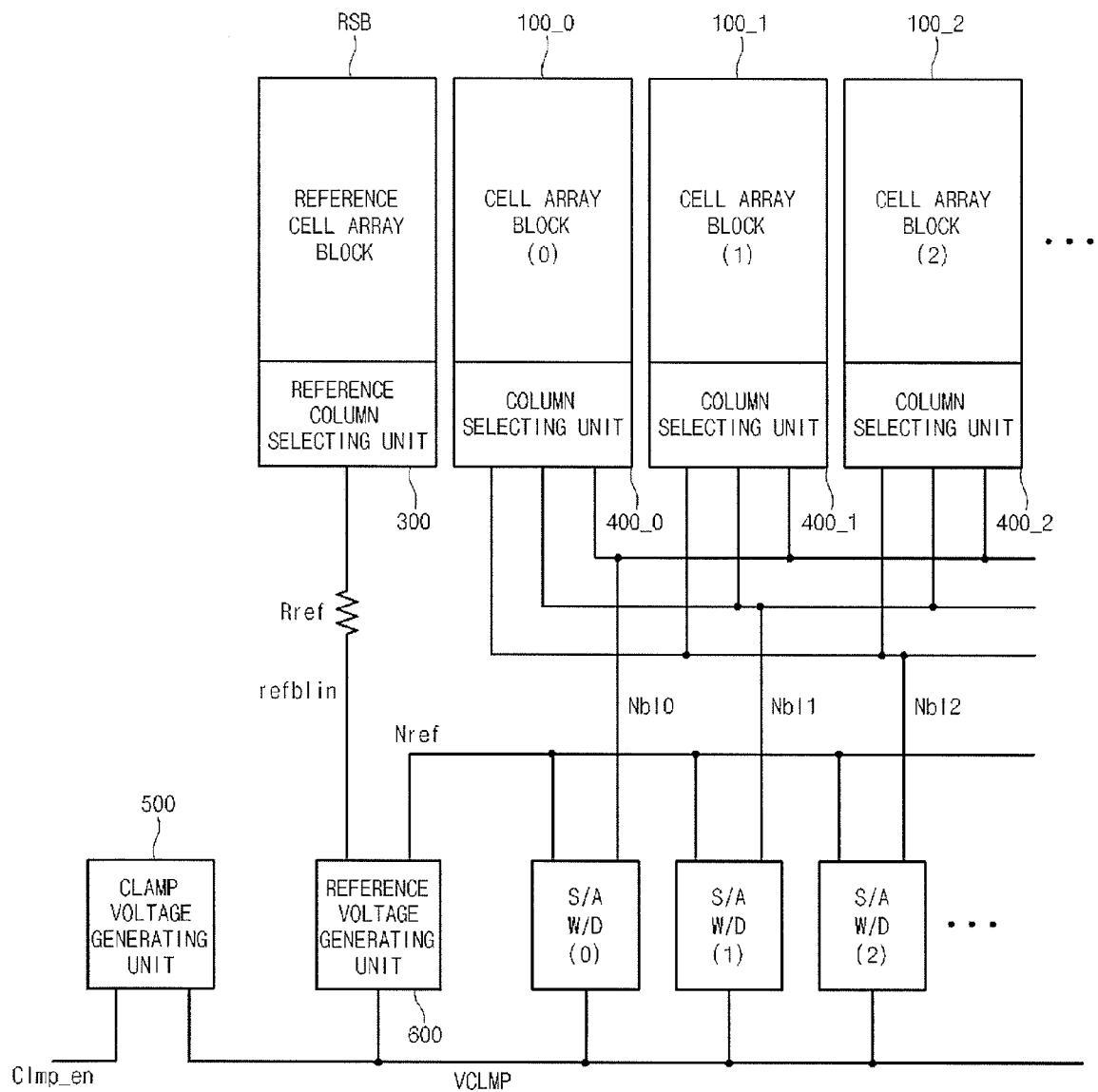
FIG. 8 is a block diagram showing a phase change memory device according to an embodiment of the present invention.

FIG. 8 is a block diagram showing a phase change memory device according to an embodiment of the present invention.

The phase change memory device comprises a reference cell array block RSB, a plurality of cell array blocks 100_0~100_2, a reference column selecting unit 300, a plurality of column selecting units 400_0~400_2, a reference resistor Rref, a clamp voltage generating unit 500, a reference voltage generating unit 600, and one or more sense amplifiers S/A and write driving units W/D.

The clamp voltage generating unit 500 generates the clamp voltage VCLMP in response to the clamp enable signal Clmp_en.

The reference column selecting unit 300 is connected to the reference cell array block RSB, and is disposed in a lower region of the reference cell array block RSB. The reference column selecting unit 300 is connected to the reference voltage generating unit 600 through the reference resistor Rref. The reference resistor Rref is connected between the reference column selecting unit 300 and a reference bit line node refblin. The reference voltage generating unit 600 outputs a reference voltage to a reference node Nref in response to the clamp voltage VCLMP and a voltage of the reference bit line node refblin.

The column selecting units 400 are connected one by one to the cell array blocks 100_0~100_2 (i.e., each of the column selecting units corresponds and is connected to one of the cell array blocks), and the column selecting units 400_0~400_2 are each disposed in a region under the cell array blocks 100_0~100_2. The reference node Nref is connected to each of the one or more sense amplifiers S/A and write driving units W/D (FIG. 8 includes a plurality of sense amplifiers S/A and write driving units W/D, and each column selecting unit is connected to one of the sense amplifiers S/A). The column selecting units 400_0~400_2 are connected one by one to nodes Nbl0~Nbl2 each of which is connected to one of the sense amplifiers S/A.

In FIG. 6, the sense amplifier S/A(0) is connected to the node Nbl0 and the reference node Nref. The sense amplifier S/A(1) is connected to the node Nbl1 and the reference node Nref. The sense amplifier S/A(2) is connected to the node Nbl2 and the reference node Nref.

Figure 9:
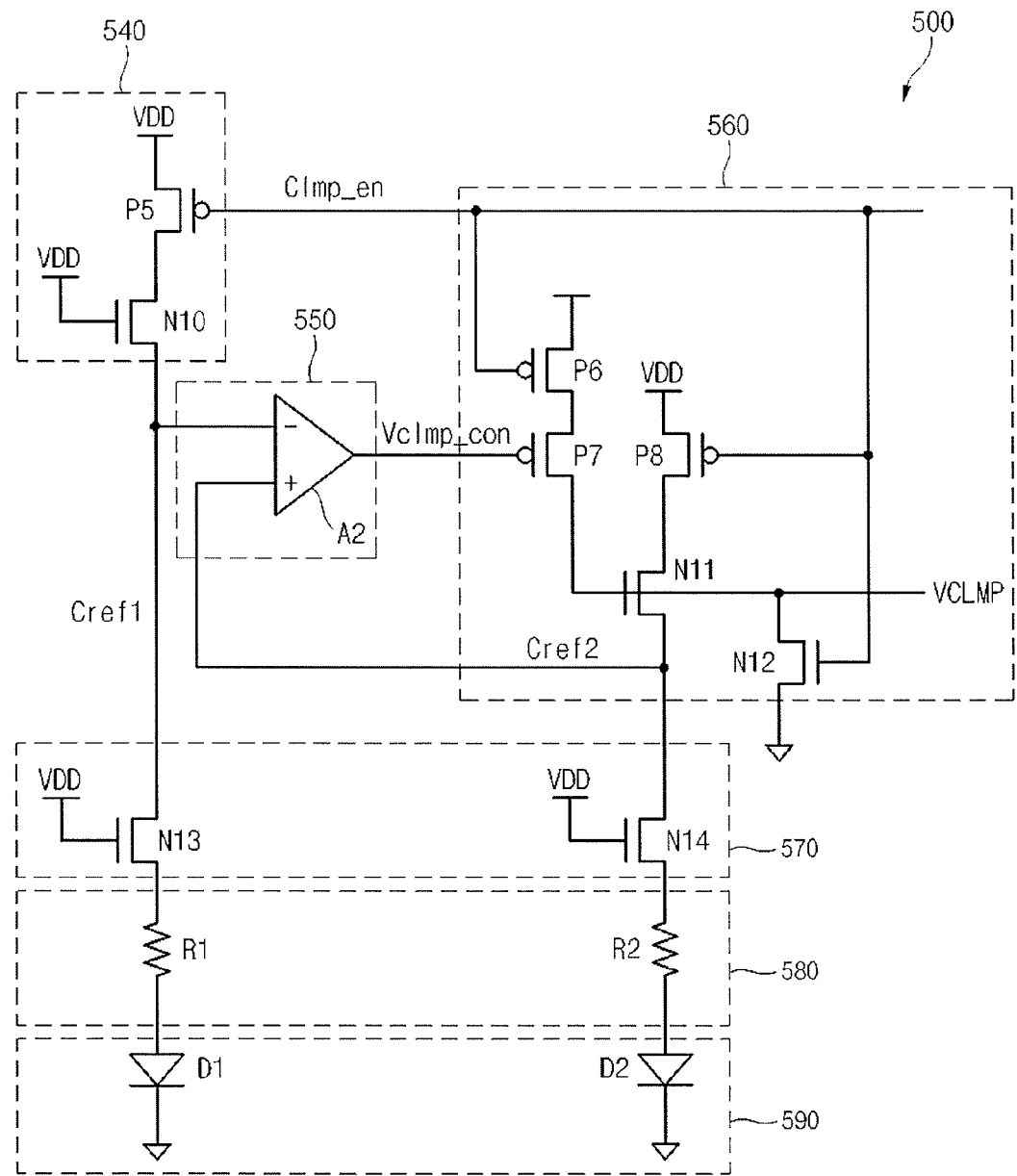
FIG. 9 is a circuit diagram showing the clamp voltage generating unit of FIG. 8.

FIG. 9 is a circuit diagram showing the clamp voltage generating unit 500 of FIG. 8.

The clamp voltage generating unit 500 includes a reference bias unit 540, a clamp voltage adjusting unit 550, a clamp voltage output unit 560, a clamp equalizing circuit unit 570, a bit line equalizing circuit unit 580, and a cell switch equalizing circuit unit 590.

The reference bias unit 540 includes a PMOS transistor P5 and an NMOS transistor N10. The PMOS transistor P5 is connected between a power voltage VDD terminal and the NMOS transistor N10, and the gate of the PMOS transistor P5 receives the clamp enable signal Clmp_en. The NMOS transistor N10 is connected between the PMOS transistor P5 and the clamp reference signal Cref1 terminal, and the gate of the NMOS transistor N10 receives the power voltage VDD.

The clamp voltage adjusting unit 550 includes an amplifier A2 that outputs a clamp voltage control signal VCLMP_con. The negative (−) terminal of the amplifier A2 receives the clamp reference signal Cref1. The positive terminal of the amplifier A2 receives the clamp reference signal Cref2.

The clamp voltage output unit 560 includes PMOS transistors P6~P8 and NMOS transistors N11, N12. The PMOS transistor P6 is connected between a power voltage terminal and the PMOS transistor P7, and the gate of the PMOS transistor P6 receives the clamp enable signal Clmp_en. The PMOS transistor P7 is connected between the PMOS transistor P6 and the gate of the NMOS transistor N11, and the gate of the PMOS transistor P7 receives the clamp voltage control signal VCLMP_con.

The PMOS transistor P8 is connected between the power voltage VDD terminal and the NMOS transistor N11, and the gate of the PMOS transistor P8 receives the clamp enable signal Clmp_en. The NMOS transistor N11 is connected between the PMOS transistor P8 and the clamp reference signal Cref2 terminal, and the gate of the NMOS transistor N11 is connected to the clamp voltage VCLMP terminal. The NMOS transistor N12 is connected between the clamp voltage VCLMP terminal and a ground voltage terminal, and the gate of the NMOS transistor N12 receives the clamp enable signal Clmp_en.

The clamp equalizing circuit unit 570 includes NMOS transistors N13, N14 which form a replica circuit. The NMOS transistor N13 is connected between the clamp reference signal Cref1 and a resistor R1, and the gate of the NMOS transistor N13 receives the power voltage VDD. The NMOS transistor N14 is connected between the clamp reference signal Cref2 and a resistor R2, and the gate of the NMOS transistor N14 receives the power voltage VDD.

The bit line equalizing circuit 580 includes the resistors R1, R2 which form a replica circuit. The resistor R1 is connected between the NMOS transistor N13 and a diode D1. The resistor R2 is connected between the NMOS transistor N14 and a diode D2.

The cell switch equalizing circuit unit 590 includes the diodes D1, D2 which form a replica circuit. The diodes D1, D2 comprise a PN diode element. The P-type region of the diode D1 is connected to the resistor R1, and the N-type region is connected to the ground voltage terminal. The P-type region of the diode D2 is connected to the resistor R2, and the N-type region is connected to the ground voltage terminal.

The operation of the clamp voltage generating unit 500 is explained below.

The circuit structure of the reference bias unit 540 is designed to generate a reference voltage for generating the clamp voltage VCLMP. The reference bias unit 540 sets a load value so that the current value of the clamp reference signal Cref1 is normal.

The reference bias unit 540 is activated in response to the clamp enable signal Clmp_en. A predetermined target current value is determined according to the NMOS transistor N10.

The clamp voltage adjusting unit 550 is an amplifying circuit configured to receive the clamp reference signal Cref1 such that the clamp reference signal Cref2 is determined according to the clamp reference signal Cref1. That is, the amplifier A2 outputs the clamp voltage control signal VCLMP_con in response to the clamp reference signal Cref1 to adjust the clamp reference signal Cref2.

The clamp voltage output unit 560 controls the output of the clamp voltage VCLMP. The clamp voltage output unit 560 is activated in response to the clamp enable signal Clmp_en.

When the clamp enable signal Clmp_en is inactivated (at a high level), the NMOS transistor N12 is turned and the clamp voltage VCLMP is maintained at a ground voltage level. Conversely, when the clamp enable signal Clmp_en is activated (at a low level), the PMOS transistors P5, P6, P8 are activated.

The PMOS transistor P7 controls the clamp voltage VCLMP in response to the clamp voltage control signal VCLMP_con. The NMOS transistor N11 determines the voltage of the clamp reference signal Cref2 in response to the clamp voltage VCLMP.

A positive (+) terminal of the amplifier A2 receives the clamp reference signal Cref2 to adjust the clamp voltage VCLMP. The clamp reference signals Cref1, Cref2 are set to maintain a predetermined offset voltage.

Figure 10:
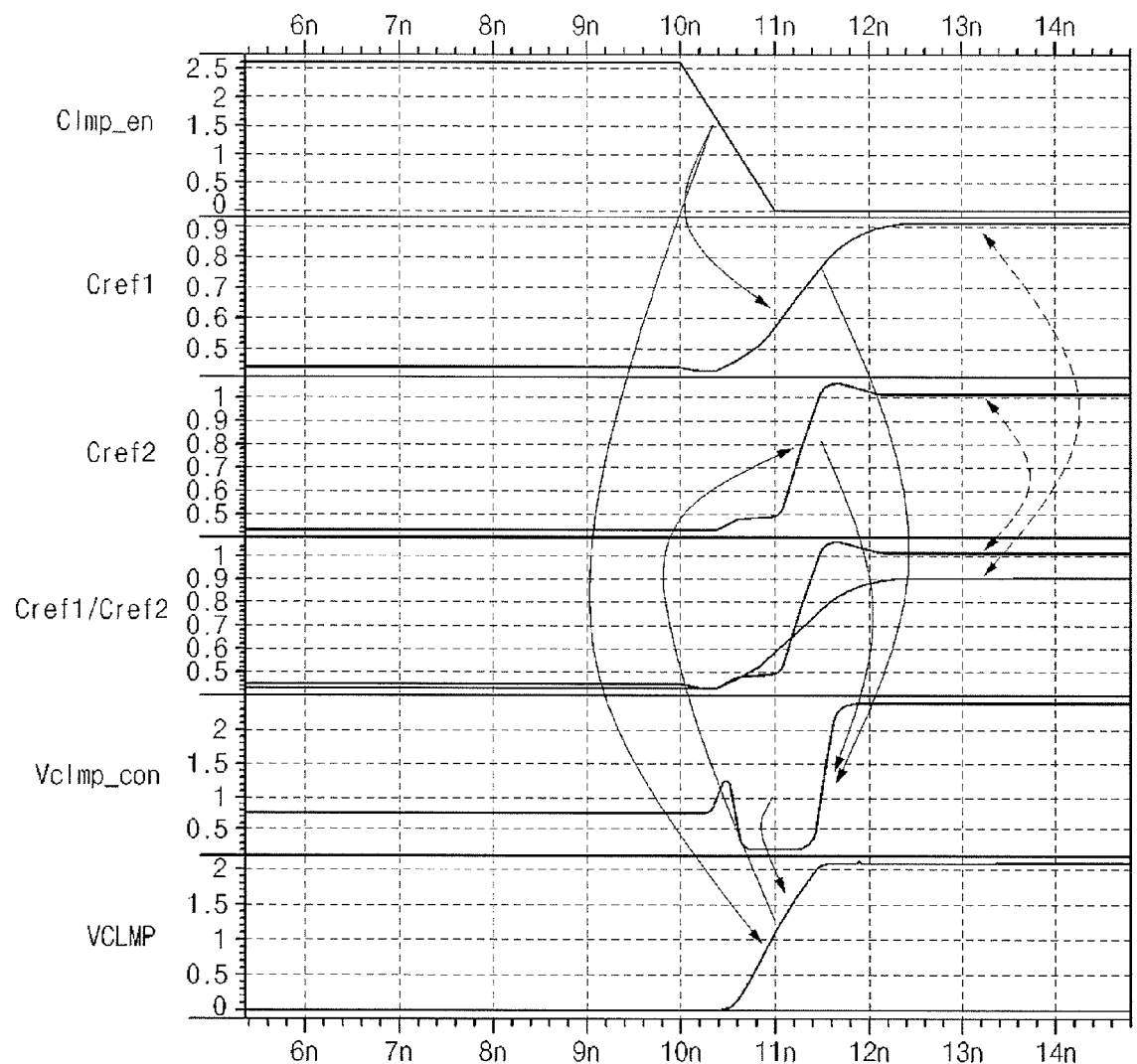
FIG. 10 is a timing diagram shown for illustrating operational characteristics of the clamp voltage generating unit of FIG. 7.

FIG. 10 is a timing diagram shown for illustrating the operation of clamp voltage generating unit 500 of FIG. 7.

In a stand-by state, the clamp enable signal Clmp_en is maintained inactivated (at a high level). The clamp reference signals Cref1, Cref2, the clamp voltage control signal VCLMP_con, and the clamp voltage VCLMP maintain a low level.

When the clamp enable signal Clmp_en is activated (at a low level), the PMOS transistor P1 is turned on. The voltage of the clamp reference signal Cref1 then rises to a predetermined bias voltage level.

The voltage of the clamp reference signal Cref2 rises after a predetermined time so that the clamp voltage control signal VCLMP_con becomes a low level. The PMOS transistor P3 is turned on in response to the low level clamp voltage control signal VCLMP_con so that the level of the clamp voltage VCLMP rises.

As the clamp voltage VCLMP rises, the clamp reference signal is Cref2 also starts to rise. When the voltage difference between the clamp reference signals Cref1, Cref2 reaches a predetermined offset voltage, the voltage of the clamp voltage control signal VCLMP_con rises to a high level. As a result, the voltage level of the clamp voltage VCLMP no longer rises.

Figure 11:
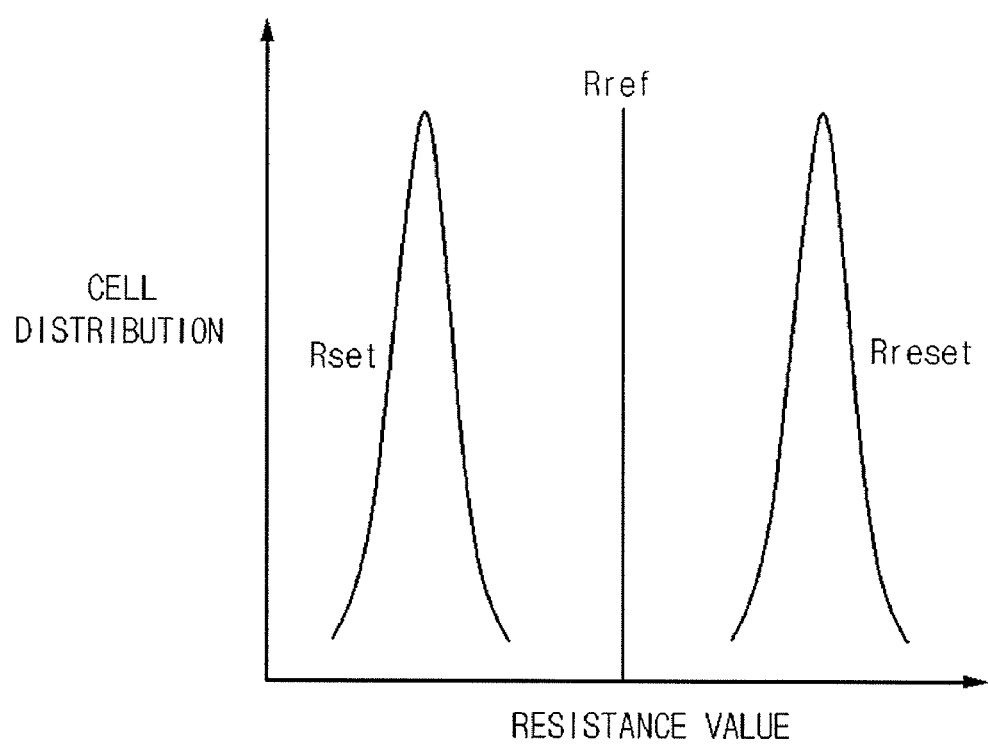
FIG. 11 is a diagram shown for illustrating relationships of a set resistance, a reset resistance, and a reference resistance of a phase change memory device according to an embodiment of the present invention.

FIG. 11 is a diagram shown for illustrating the relationships of a set resistance, a reset resistance, and a reference resistance of a phase change memory device according to embodiments of the present invention.

As shown in FIG. 11, a set resistance Rset (corresponding to a crystalline state) flowing through the bit line BL has a resistance value smaller than that of the reference resistor Rref. A reset resistance Rreset (corresponding to an amorphous state) flowing through the bit line BL has a resistance value larger than that of the reference resistor Rref.

Figure 12:
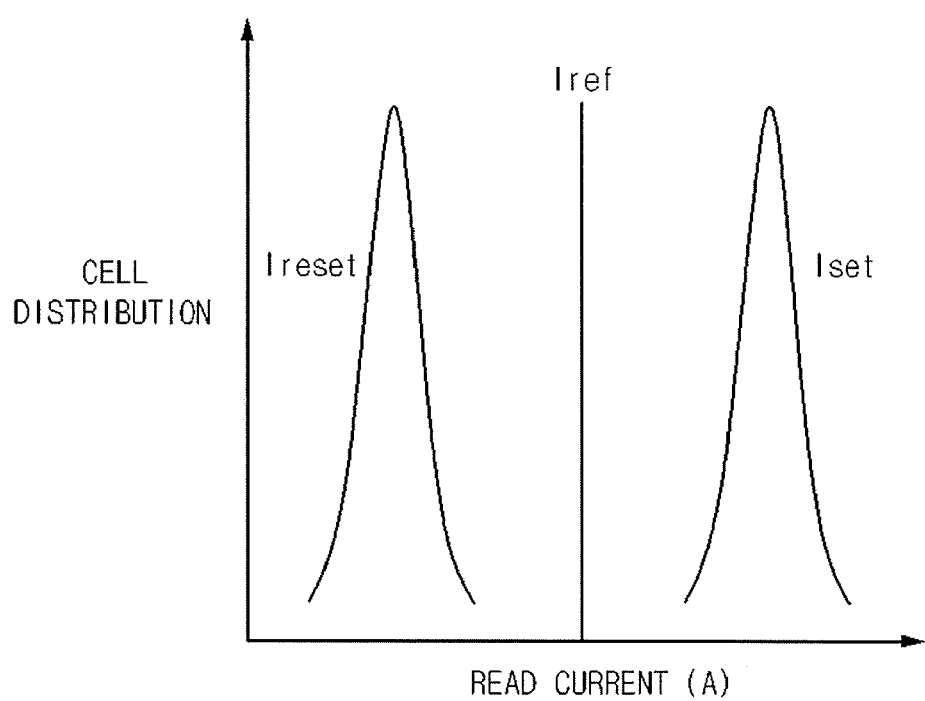
FIG. 12 is a diagram shown for illustrating relationships of read currents of a phase change memory device according to an embodiment of the present invention.

FIG. 12 is a diagram shown for illustrating the relationships of read currents of a phase change memory device according to embodiments of the present invention.

When data is being read, a set current Iset (corresponding to a crystalline state) flowing through the bit line BL has a current value higher than that of the reference current Iref. A reset current Ireset (corresponding to an amorphous state) flowing through the bit line BL has a current value lower than that of the reference current Iref.

Figure 13:
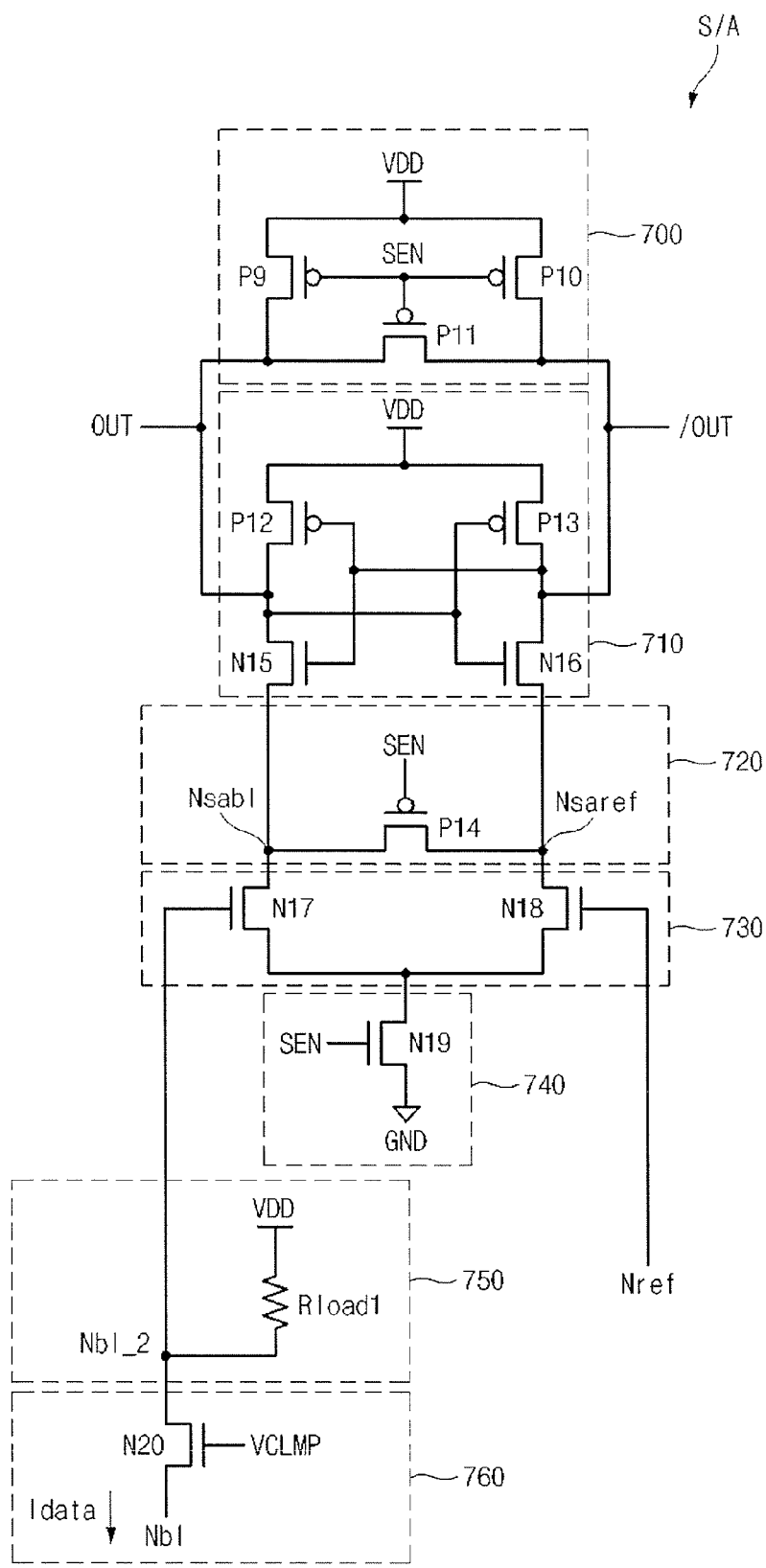
FIG. 13 is a circuit diagram showing the sense amplifier of FIG. 4.

FIG. 13 is a circuit diagram showing the sense amplifier of FIG. 4.

The sense amplifier S/A includes an equalizing unit 700, an amplifying unit 710, a pull-up unit 720, an amplifying unit 730, an amplifying activation control unit 740, a current sense load unit 750, and a bias control unit 760.

The equalizing unit 700 includes PMOS transistors P9~P11. The PMOS transistor P9 is connected between a power voltage VDD terminal and an output terminal OUT. The PMOS transistor P10 is connected between the power voltage VDD terminal and an output terminal /OUT. The PMOS transistor P11 is connected between the output terminals OUT, /OUT. The PMOS transistors P9~P11 have a common gate receiving a sense amplifier enable signal SEN.

The amplifying unit 710 includes PMOS transistors P12, P13 and NMOS transistors N15, N16. The PMOS transistors P12, P13 are cross-coupled with the NMOS transistors N15, N16.

The pull-up unit 720 includes a PMOS transistor P14. The PMOS transistor P14 is connected between a node Nsabl and a node Nsaref, and the gate of the PMOS transistor P14 receives the sense amplifier enable signal SEN.

The amplifying unit 730 includes NMOS transistors N17, N18. The NMOS transistor N17 is connected between the node Nsabl and an NMOS transistor N19, and the gate of the NMOS transistor N17 is connected to a node Nbl_2. The NMOS transistor N18 is connected between the node Nsaref and the NMOS transistor N19, and the gate of the NMOS transistor N18 receives the voltage of reference node Nref_2.

The amplifying activation control unit 740 includes the NMOS transistor N19. The NMOS transistor N19 is connected between the amplifying unit 730 and a ground voltage GND terminal, and the gate of the NMOS transistor N19 receives the sense amplifier enable signal SEN. The current sense load unit 750 includes a load resistor Rload1. The load resistor Rload1 is connected between the power voltage VDD terminal and the node Nbl_2.

The bias control unit 760 includes an NMOS transistor N20. The NMOS transistor N20 is connected between the node Nbl_2 and the node Nbl, and the gate of the NMOS transistor N20 receives a clamp voltage VCLMP.

Figure 14:
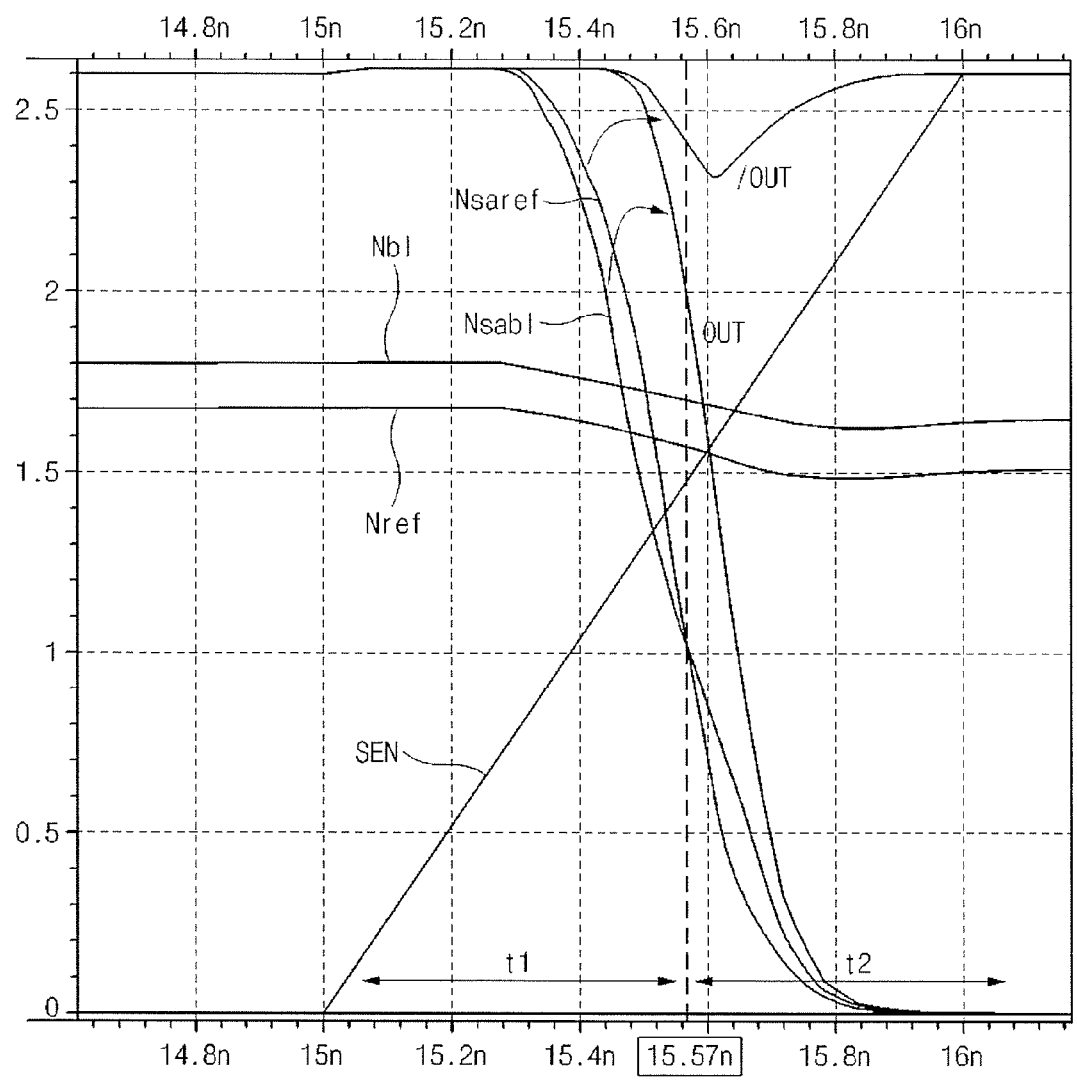
FIG. 14 is a waveform diagram shown for illustrating the operation of the first and second amplifying units of the sense amplifier of FIG. 13.

FIG. 14 is a waveform diagram shown for illustrating the operation of the sense amplifier S/A of FIG. 13.

When the clamp voltage VCLMP rises, the NMOS transistor N20 is turned on to transmit a data current Idata of the bit line BL to the node Nbl_2. That is, the gate voltage of the NMOS transistor N20 is controlled by the clamp voltage VCLMP to allow the data current Idata to transmit.

The current sense load unit 750 includes the load resistor Rload1 controlled by a load voltage. The current of the bit line BL is converted into a sensing voltage value in the node Nbl_2 by the load value of the load resistor Rload1.

The amplifying activation control unit 740 is controlled by the sense amplifier enable signal SEN. The amplifying units 710, 730 are activated according to the activation state of the amplifying activation control unit 740. The amplifying unit 730 amplifies voltage values of the node Nbl_2 and the reference voltage Nref_2 using the gain of the NMOS transistors N17, N18.

Both ends of the nodes Nsabl, Nsaref are precharged to a high level during a precharge period depending on the operation of the pull-up unit 720. The precharging operation improves the first amplifying characteristic of the sense amplifier S/A. The improvement becomes evident when referring to FIG. 14. During period t1, both ends of the nodes Nsabl, Nsaref are pulled down from the precharged value to have an amplified voltage value. The voltage amplified in the amplifying unit 730 is transmitted to the amplifying unit 710, thereby improving a second amplifying characteristic of the sense amplifier S/A.

The amplifying unit 710 amplifies a gain of the amplifying unit 730 to improve an offset characteristic of the sense amplifier S/A. As can be seen from FIG. 14, the equalizing unit 700 precharges the output signal OUT, /OUT of the amplifying unit 710 to a high level during the precharge period.

Figure 15:
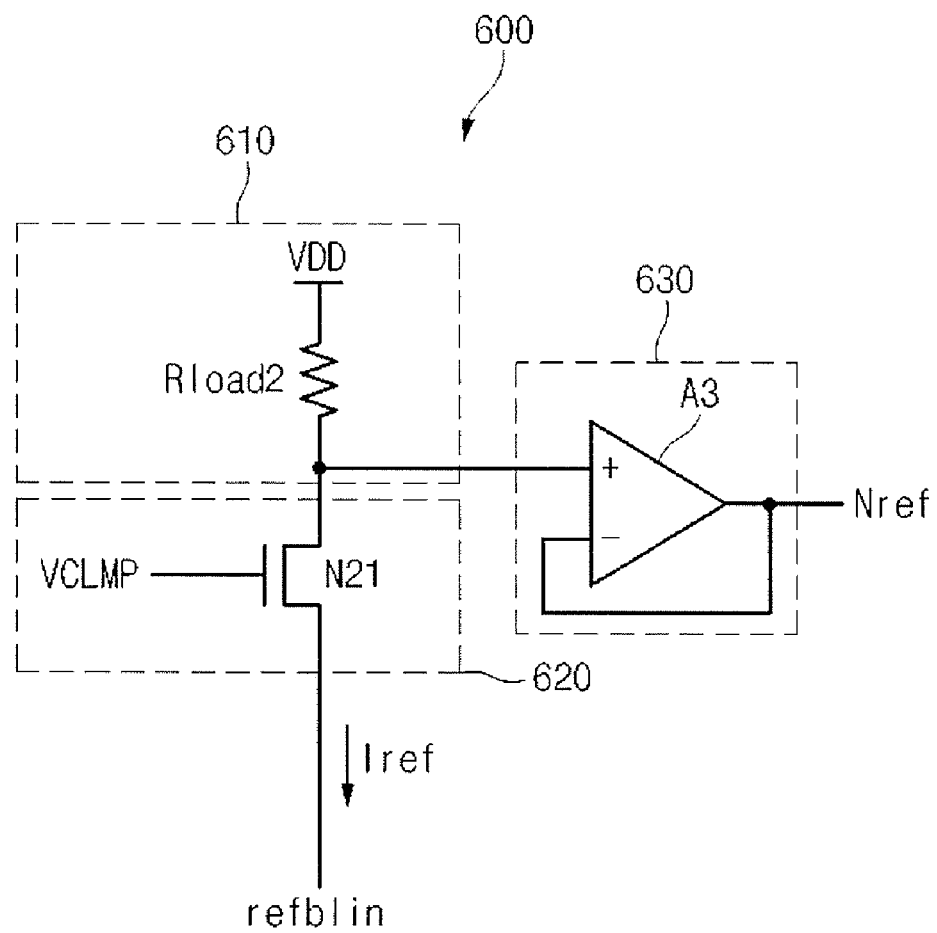
FIG. 15 is a circuit diagram showing the reference voltage generating unit of FIG. 4.

FIG. 15 is a circuit diagram showing the reference voltage generating unit 600 of FIG. 4.

Referring to FIG. 15, the reference voltage generating unit 600 includes a current sense load unit 610, a bit line voltage bias control unit 620, and an amplifying unit 630.

The current sense load unit 610 includes a load resistor Rload2 connected between the power voltage VDD terminal and the bit line voltage bias control unit 620. The bit line voltage bias control unit 620 includes an NMOS transistor N21 connected between the current sense load unit 610 and the reference bit line node refblin. The gate of the NMOS transistor N21 receives the clamp voltage VCLMP.

The amplifying unit 630 includes an amplifier A3 configured to amplify output signals of the current sense load unit 610 and the bit line voltage bias control unit 620. The positive terminal (+) of the amplifier A3 is connected to a common output terminal shared by the current sense load unit 610 and the bit line voltage bias control unit 620, and the negative (−) terminal of the amplifier A3 is connected to the reference node Nref.

The reference voltage generating unit 600 uses the clamp voltage VCLMP to control the gate voltage of the NMOS transistor N21. The reference current Iref is converted into a reference voltage value by the load value of the load resistor Rload2. The amplifier A3 amplifies the reference voltage value to output the value to the reference node Nref.

Figure 16:
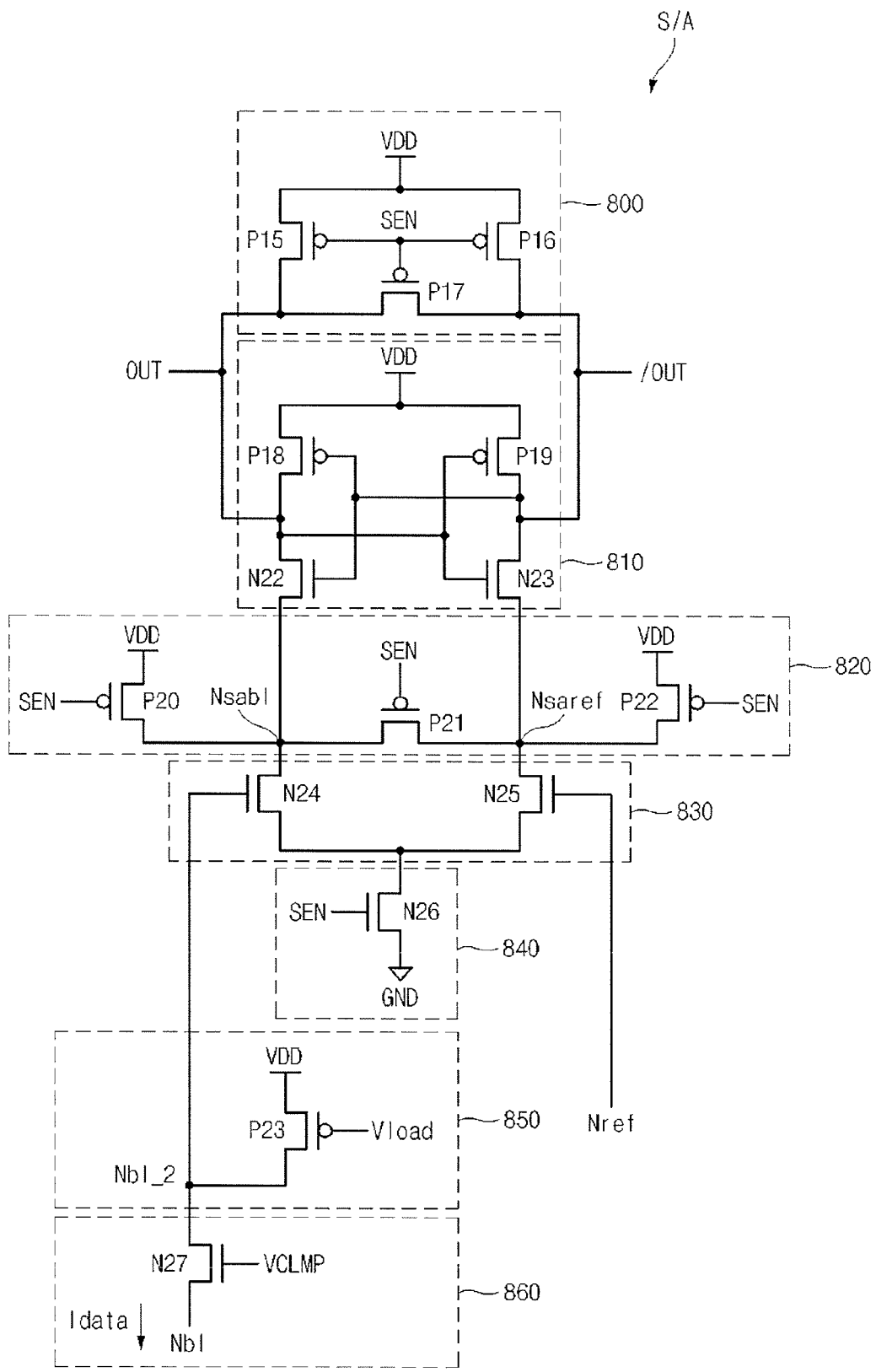
FIG. 16 is a circuit diagram showing the sense amplifier of FIG. 4.

FIG. 16 is a diagram showing the sense amplifier S/A of FIG. 4 according to another embodiment of the present invention.

Referring to FIG. 4, the sense amplifier S/A includes an equalizing unit 800, an amplifying unit 810, a pull-up unit 820, an amplifying unit 830, an amplifying activation control unit 840, a current sense load unit 850, and a bias control unit 860.

The equalizing unit 800 includes PMOS transistors P15~P17. The PMOS transistor P15 is connected between a power voltage VDD terminal and an output terminal OUT. The PMOS transistor P16 is connected between the power voltage VDD terminal and an output terminal /OUT. The PMOS transistor P17 is connected between the output terminals OUT, /OUT. The PMOS transistors P15~P17 have a common gate receiving a sense amplifier enable signal SEN.

The amplifying unit 810 includes PMOS transistors P18, P19 and NMOS transistors N22, N23. The PMOS transistors P18, P19 are cross-coupled with the NMOS transistors N22, N23.

The pull-up unit 820 includes PMOS transistors P20~P22. The PMOS transistor P20 is connected between the power voltage VDD terminal and the node Nsabl, and the gate of the PMOS transistor P20 receives the sense amplifier enable signal SEN. The PMOS transistor P22 is connected between the power voltage VDD terminal and the node Nsaref, and the gate of the PMOS transistor P22 receives the sense amplifier enable signal SEN. The PMOS transistor P21 is connected between the node Nsabl and the node Nsaref, and the gate of the PMOS transistor P21 receives the sense amplifier enable signal SEN.

The amplifying unit 830 includes NMOS transistors N24, N25. The NMOS transistor N24 is connected between the node Nsabl and an NMOS transistor N26, and the gate of the NMOS transistor N24 is connected to a node Nbl_2. The NMOS transistor N25 is connected between the node Nsaref and the NMOS transistor N26, and the gate of the NMOS transistor N24 receives the voltage of reference node Nref.

The amplifying activation control unit 840 includes the NMOS transistor N26. The NMOS transistor N26 is connected between the amplifying unit 830 and a ground voltage GND terminal, and the gate of the NMOS transistor N26 receives the sense amplifier enable signal SEN. The current sense load unit 850 includes a PMOS transistor P23. The PMOS transistor P23 is connected between the power voltage VDD terminal and the node Nbl_2, and the gate of the PMOS transistor receives the load voltage Vload.

The bias control unit 860 includes an NMOS transistors N27. The NMOS transistor N27 is connected between the node Nbl_2 and the node Nbl, and the gate of the NMOS transistor N27 receives the clamp voltage VCLMP.

Figure 17:
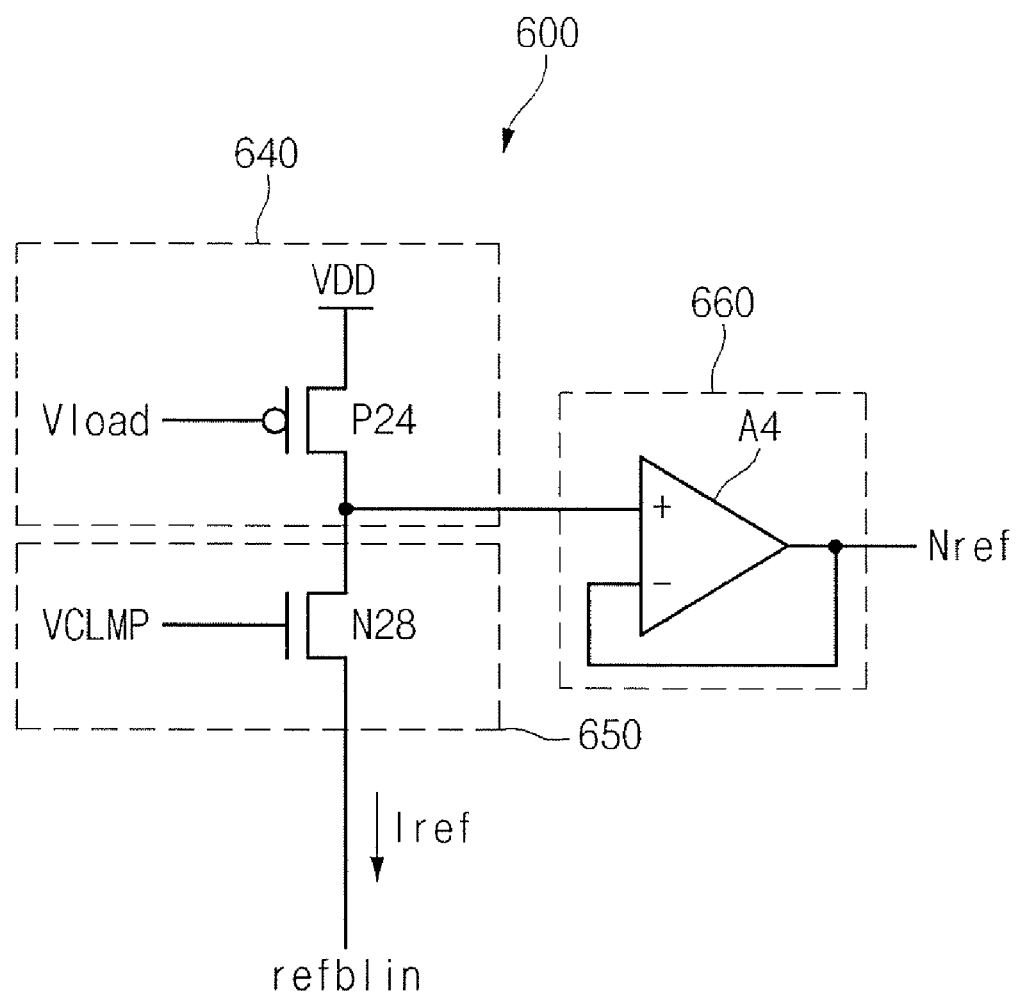
FIG. 17 is a circuit diagram showing the reference voltage generating unit of FIG. 4.

FIG. 17 is a diagram showing the reference voltage generating unit 600 of FIG. 4 according to another embodiment of the present invention.

The reference voltage generating unit 600 includes a current sense load unit 640, a bit line voltage bias control unit 650, and an amplifying unit 660.

The current sense load unit 640 includes a PMOS transistor P24 connected between the power voltage VDD terminal and the bit line voltage bias control unit 650. The gate of the PMOS transistor P24 receives a load voltage Vload. The bit line voltage bias control unit 650 includes an NMOS transistor N28 connected between the current sense load unit 640 and the reference bit line node refblin. The gate of the NMOS transistor N28 receives the clamp voltage VCLMP.

The amplifying unit 660 includes an amplifier A4 configured to amplify the output signals of the current sense load unit 640 and the bit line voltage bias control unit 650. The current sense load unit 640 and the bit line voltage bias control unit 650 share a common output terminal. The positive (+) terminal of the amplifier A4 is connected to the common output terminal of the current sense load unit 640 and the bit line voltage bias control unit 650, and the negative (−) terminal is connected to the reference node Nref.

In the reference voltage generating unit 600 the gate voltage of the NMOS transistor N28 is controlled by the value of the clamp voltage VCLMP. The reference current Iref is converted into a reference voltage value by the load value of the PMOS transistor P24. The amplifier A4 amplifies the reference voltage value to output the value to the reference node Nref.

Figure 18:
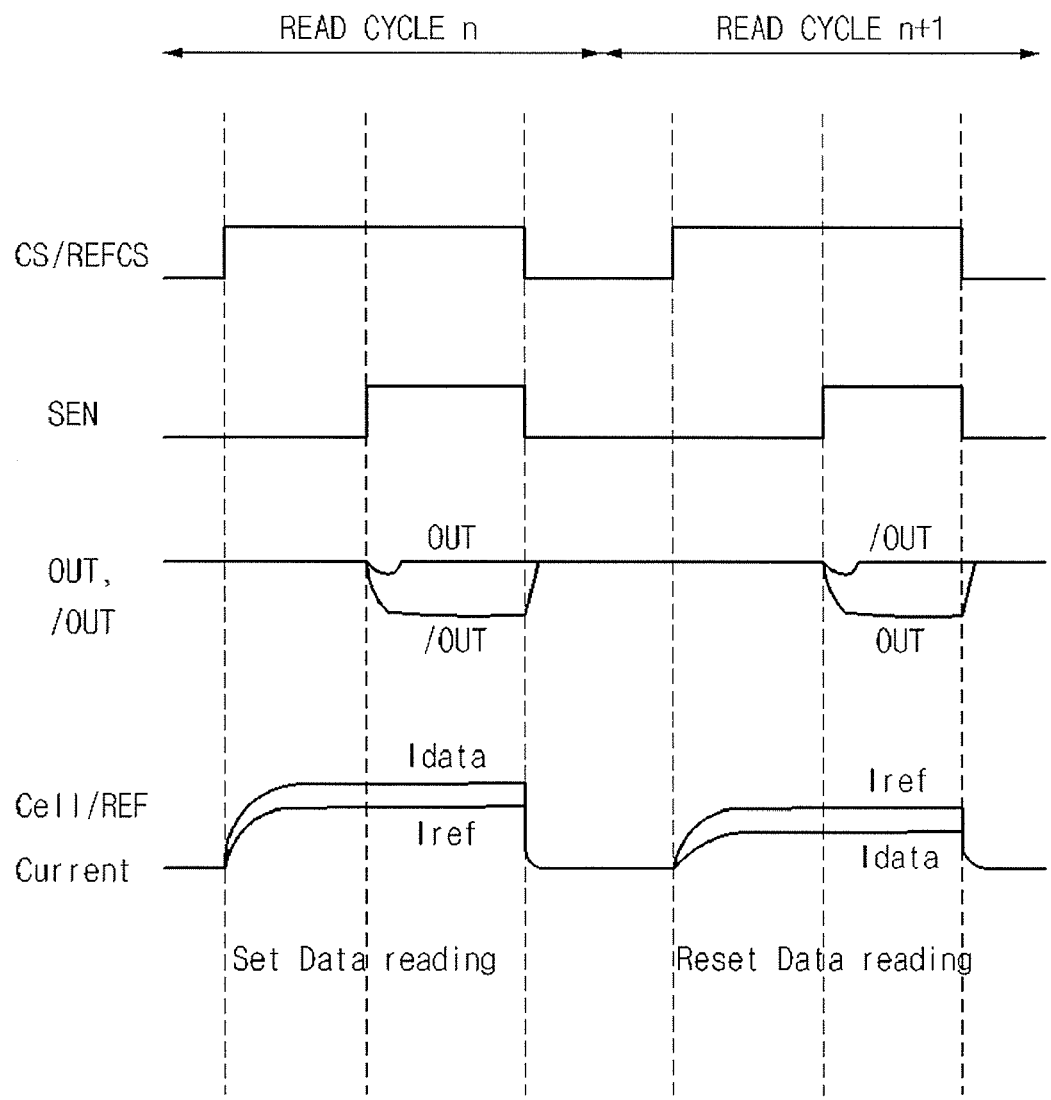
FIG. 18 is a timing diagram shown for illustrating the operating voltage of the sense amplifier of FIG. 13.

FIG. 18 is a timing diagram shown for illustrating an operating voltage of the sense amplifier of FIG. 13. FIG. 18 shows the current sensing operation of data logic value "1" and a data logic value "0" in two different read cycles.

Referring to FIG. 18, in the read cycle n, when a column selecting signal CS and the reference column selecting signal REFCS are activated, the data current Idata and the reference current Iref of the cell begin to flow. The sense amplifier enable signal SEN is activated after a predetermined time, and the voltage of the output terminals OUT, /OUT is amplified. When the data current Idata is larger than the reference current Iref, the output terminal OUT is outputted at a high level and the output terminal /OUT is outputted at a low level.

In a read cycle n+1, when the column selecting signal CS and the reference column selecting signal REFCS are activated, the data current Idata and the reference current Iref of the cell begin to flow. The sense amplifier enable signal SEN is activated after a predetermined time, a voltage of the output terminals OUT, /OUT is amplified. When the data current Idata is smaller than the reference current Iref, the output terminal OUT is outputted at a low level and the output terminal /OUT is outputted at a high level.

As described above, the phase change memory device having phase change resistors according to embodiments of the present invention improves the stability and accuracy of reference currents using a reference cell array.

Additionally, the phase change memory device having phase change resistors according to embodiments of the present invention improves the stability and accuracy of clamp voltages by utilizing a clamp cell array operating under the same conditions as that of the cell array.

Additionally, the phase change memory device having the phase change resistors according to embodiments of the present invention improves the sensing efficiency of a sense amplifier by utilizing a reference cell array having the same timing delay element.

Additionally, the phase change memory device having phase change resistors according to embodiments of the present invention improves the offset characteristic of a sense amplifier.

Additionally, the phase change memory device having phase change resistors according to embodiments of the present invention provides an equalizing circuit, which operates under the same conditions as that of a main cell array, to generate reference and clamp voltages that reflect the characteristics of the main cell array and thus reflects changes in process of the semiconductor memory device.

Although a number of illustrative embodiments consistent with the invention have been described above, it should be understood that numerous modifications and embodiments can be devised by those skilled in the art that fall within the spirit and scope of this disclosure. More particularly, a number of variations and modifications are possible in the component parts and/or arrangements that are within the scope of the disclosure, the drawings, and the accompanying claims. In addition to variations and modifications in the component parts and/or arrangements, alternative uses will also be apparent to those skilled in the art.

What is claimed is:

1. A phase change memory device comprising:
   a plurality of word lines arranged in a row direction;
   a plurality of bit lines arranged in a column direction;
   a reference bit line arranged in the column direction;
   a plurality of clamp bit lines arranged in the column direction;
   a cell array block comprising a plurality of phase change resistance cells each of which is formed at the intersection of one of the word lines and one of the bit lines, wherein the cell array block is configured to output a data current;
   a reference cell array block comprising a plurality of reference cells each of which is formed at the intersection of one of the word lines and the reference bit line, wherein the reference cell array block is configured to output a reference current;
   a clamp cell array block comprising a plurality of clamp cells each of which is formed at the intersection of a word line and the clamp bit line, wherein the clamp cell array block is configured to output a plurality of clamp currents; and
   a sense amplifier connected to the bit lines to receive the data current and performing amplification in response to a clamp voltage corresponding to the plurality of clamp currents and a reference voltage corresponding to the reference current.

2. The phase change memory device according to claim 1, further comprising:
   a clamp voltage generating unit connected to each of the clamp bit lines and configured to generate the clamp voltage corresponding to the clamp currents; and
   a reference voltage generating unit connected to the reference bit line and receiving the clamp voltage, wherein the reference voltage generating unit is configured to generate the reference voltage corresponding to the reference current in response to the clamp voltage.

3. The phase change memory device according to claim 2, further comprising:
   a column selecting unit connected to each of the plurality of bit lines of the cell array block and configured to select one or more of the bit lines;
   a reference column selecting unit connected to the reference bit line of the reference cell array block and configured to select the reference bit line; and
   a clamp column selecting unit connected to each of the plurality of clamp bit lines of the clamp cell array block and configured to select the clamp bit lines.

4. The phase change memory device according to claim 3, further comprising a reference resistor connected between the reference column selecting unit and the reference voltage generating unit.

5. The phase change memory device according to claim 2, wherein the clamp voltage generating unit comprises:
   a reference bias unit configured to supply a bias voltage to a first clamp bit line of the plurality of clamp bit lines;
   a clamp voltage adjusting unit connected to the first clamp bit line and a second clamp bit line of the plurality of bit lines, wherein the clamp voltage adjusting unit is configured to output a clamp voltage control signal for adjusting the clamp voltage according to a voltage value of the second clamp bit line; and
   a clamp voltage output unit configured to output the clamp voltage according to the clamp voltage control signal.

6. The phase change memory device according to claim 5, wherein the clamp voltage adjusting unit comprises an amplifier configured to compare and amplify output signals of the first and second clamp bit lines to output the clamp voltage control signal.

7. The phase change memory device according to claim 5, wherein the clamp voltage output unit controls a level of the clamp voltage according to the clamp voltage control signal when a clamp enable signal is activated, and pulls down the clamp voltage when the clamp enable signal is inactivated.

8. The phase change memory device according to claim 2, wherein the reference voltage generating unit comprises:
   a current sense load unit configured to convert the reference current to the reference voltage;
   a bit line voltage bias control unit configured to control the reference voltage flowing in the reference bit line according to the clamp voltage; and
   an amplifying unit configured to amplify output signals of the current sense load unit and the bit line voltage bias control unit and outputting the reference voltage.

9. The phase change memory device according to claim 1, wherein the sense amplifier comprises:
   an equalizing unit configured to precharge an output terminal during a precharge period;
   an amplifying unit configured to amplify voltages of a bit line voltage terminal and a reference voltage terminal, wherein the voltage of the reference voltage terminal is the reference voltage corresponding to the reference current;
   a pull-up unit configured to precharge nodes of the amplifying unit during the precharge period;
   an amplifying activation control unit configured to control activation of the amplifying unit in response to a sense amplifier enable signal;
   a current sense load unit configured to convert the data current of the bit line to a sensing voltage applied to the bit line voltage terminal; and
   a bias control unit configured to control the reference current according to the clamp voltage.

10. The phase change memory device according to claim 1, wherein the plurality of clamp bit lines is a pair of clamp bit lines.

11. The phase change memory device according to claim 1, wherein the phase change resistance cell comprises:
   a phase change resistor configured to store data corresponding to a phase of a phase change layer that changes according to the current applied to the phase change layer, wherein the phase change resistor is connected to one of the bit lines; and
   a diode element connected between the phase change resistor and the intersecting word line.

12. The phase change memory device according to claim 1, wherein each of the reference cells comprises a diode element connected between the reference bit line and the intersecting word line.

13. The phase change memory device according to claim 12, wherein each of the reference cells further comprises a phase change resistor configured to store data corresponding to a phase of a phase change layer that changes according to the current applied to the phase change layer.

14. The phase change memory device according to claim 1, wherein a reset resistance flowing in the bit line is larger than a reference resistance and a set resistance is smaller than the reference resistance.

15. The phase change memory device according to claim 1, wherein a reset current flowing in the bit line is smaller than the reference current and a set current is larger than the reference current.

16. The phase change memory device according to claim 1, wherein each of the clamp cells comprises a diode element connected between the clamp bit line and the intersecting word line.

17. The phase change memory device according to claim 16, wherein each of the clamp cells further comprises a phase change resistor configured to store data corresponding to a phase of a phase change layer that changes according to the current applied to the phase change layer.

* * * * *